United States Patent
Cho et al.

(10) Patent No.: US 9,466,801 B2
(45) Date of Patent: Oct. 11, 2016

(54) ORGANIC LIGHT-EMITTING DEVICE AND ORGANIC LIGHT-EMITTING DISPLAY APPARATUS INCLUDING THE SAME

(75) Inventors: Hwan-Hee Cho, Yongin-si (KR); Moon-Jae Lee, Yongin-si (KR); Ji-Hyun Seo, Yongin-si (KR); Jae-Hyun Kwak, Yongin-si (KR); Young-Ho Park, Yongin-si (KR); Chang-Woong Chu, Yongin-si (KR); Mi-Kyung Kim, Yongin-si (KR); Kwan-Hee Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 686 days.

(21) Appl. No.: 13/592,277

(22) Filed: Aug. 22, 2012

(65) Prior Publication Data
US 2013/0256634 A1    Oct. 3, 2013

(30) Foreign Application Priority Data
Mar. 27, 2012  (KR) .......................... 10-2012-0031217

(51) Int. Cl.
*H01L 51/50*    (2006.01)
*H01L 51/00*    (2006.01)

(52) U.S. Cl.
CPC ....... *H01L 51/0067* (2013.01); *H01L 51/0072* (2013.01); *H01L 51/0061* (2013.01); *H01L51/0077* (2013.01); *H01L 51/0085* (2013.01); *H01L 51/5016* (2013.01); *H01L 51/5072* (2013.01)

(58) Field of Classification Search
None
See application file for complete search history.

(56) References Cited

U.S. PATENT DOCUMENTS

| | | | |
|---|---|---|---|
| 7,993,760 B2 | 8/2011 | Komori et al. | |
| 2006/0118789 A1* | 6/2006 | Suh et al. | 257/72 |
| 2006/0251920 A1* | 11/2006 | Aziz et al. | 428/690 |
| 2009/0167161 A1* | 7/2009 | Yabunouchi et al. | 313/504 |
| 2009/0261717 A1 | 10/2009 | Buesing et al. | |
| 2011/0095282 A1 | 4/2011 | Pflumm et al. | |
| 2011/0190494 A1* | 8/2011 | Aihara | C07D 401/14 544/180 |
| 2011/0240979 A1* | 10/2011 | Kim et al. | 257/40 |
| 2012/0001161 A1* | 1/2012 | Nakano et al. | 257/40 |
| 2012/0068170 A1 | 3/2012 | Pflumm et al. | |

FOREIGN PATENT DOCUMENTS

| | | | |
|---|---|---|---|
| JP | 2008-124268 | * 5/2008 | ............ H01L 51/50 |
| JP | 2009-184987 | * 8/2009 | ............ H01L 51/50 |
| KR | 10-2008-0085001 | 9/2008 | |
| KR | 10-2008-0109000 | 12/2008 | |
| KR | 10-2010-0130197 | 12/2010 | |
| KR | 10-2011-0112186 | 10/2011 | |
| WO | WO 2010107244 | * 9/2010 | ............ G09K 11/06 |

* cited by examiner

*Primary Examiner* — Gregory Clark
(74) *Attorney, Agent, or Firm* — Lewis Roca Rothgerber Christie LLP

(57) ABSTRACT

An organic light-emitting device includes a first electrode, a second electrode facing the first electrode, a phosphorescent emission layer between the first electrode and the second electrode, and an electron transport layer between the phosphorescent emission layer and the second electrode. The phosphorescent emission layer includes a compound represented by one of Formulae 1a to 1c, and the electron transport layer includes a metal-containing compound and a compound represented by Formula 2.

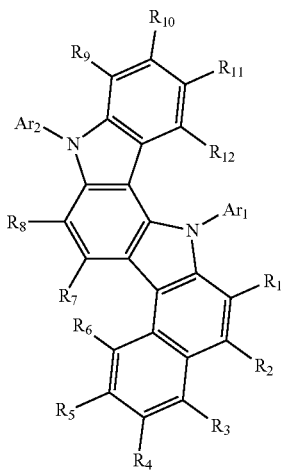

Formula 1a

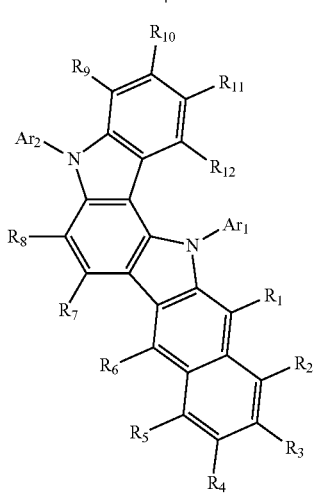

Formula 1b

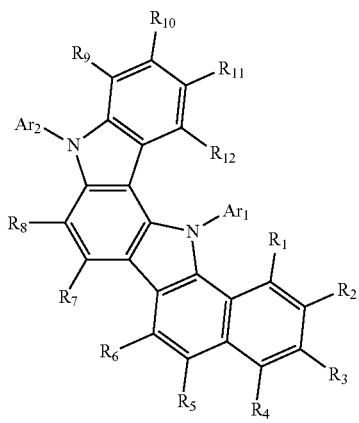

Formula 1c

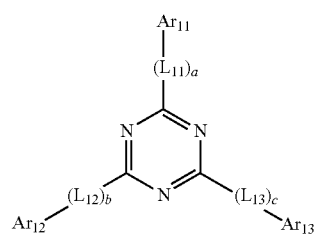

Formula 2

20 Claims, 3 Drawing Sheets

ORGANIC LIGHT-EMITTING DEVICE AND ORGANIC LIGHT-EMITTING DISPLAY APPARATUS INCLUDING THE SAME

CROSS-REFERENCE TO RELATED PATENT APPLICATION

This application claims priority to and the benefit of Korean Patent Application No. 10-2012-0031217, filed on Mar. 27, 2012 in the Korean Intellectual Property Office, the entire content of which is incorporated herein by reference.

BACKGROUND

1. Technical Field

The present invention relates to organic light-emitting devices, and to organic light-emitting display apparatuses including the organic light-emitting devices.

2. Description of the Related Art

Organic light-emitting devices (OLEDs) are self-emitting devices that have advantages such as wide viewing angles, good contrast, quick response times, high luminance, and good driving voltage characteristics. OLEDs can also provide multicolored images. Thus, organic light-emitting devices have recently drawn attention.

An organic light-emitting device includes an anode, a hole transport layer (HTL), an emission layer (EML), an electron transport layer (ETL), and a cathode, which are sequentially formed on a substrate. The HTL, the emission layer, and the ETL are formed of organic compounds. When a voltage is applied between the anode and the cathode of the organic light-emitting device, holes injected from the anode move to the EML via the HTL, and electrons injected from the cathode move to the EML via the ETL. These carriers, i.e., the holes and electrons, recombine in the EML to generate excitons. When the excitons drop from an excited state to the ground state, light is emitted.

The luminescent material is the most important factor in the light emission efficiency of an organic light-emitting device. Fluorescent materials have been widely used as the luminescent materials, and phosphorescent materials are theoretically capable of improving emission efficiency by up to 4 times that of fluorescent materials. As such, use of phosphorescent materials in the electroluminescent mechanism is increasing.

However, in organic light-emitting devices using phosphorescent luminescent materials, in most cases cycle life decreases as emission efficiency increases, and emission efficiency decreases as cycle life increases. For example, in a phosphorescent organic light-emitting device having luminance and emission efficiency suitable for use, when luminance is 97%, cycle life is about 100 hours, which is far less than the commercially available level.

SUMMARY OF THE INVENTION

Embodiments of the present invention provide an organic light-emitting device including a phosphorescent material and having good emission efficiency and a long cycle life.

Embodiments of the present invention also provide an organic light-emitting display apparatus having good light emission efficiency and long cycle life by including the organic light-emitting device.

According to an aspect of the present invention, an organic light-emitting device includes: a first electrode, a second electrode facing the first electrode, a phosphorescent emission layer between the first electrode and the second electrode, and an electron transport layer between the phosphorescent emission layer and the second electrode. The phosphorescent emission layer includes a compound represented by one of Formulae 1a to 1c below, and the electron transport layer includes a compound represented by Formula 2 below and a metal-containing compound.

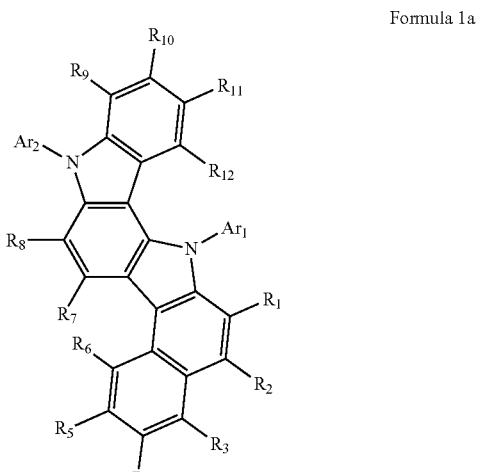

Formula 1a

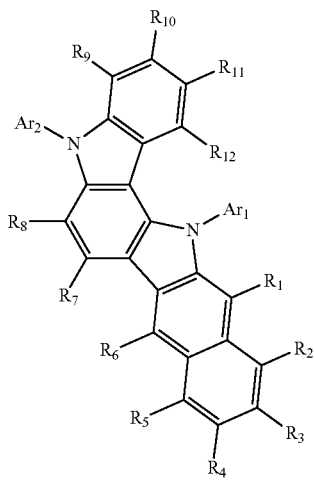

Formula 1b

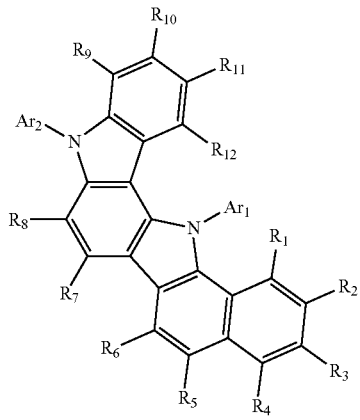

Formula 1c

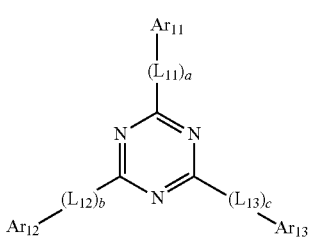

Formula 2

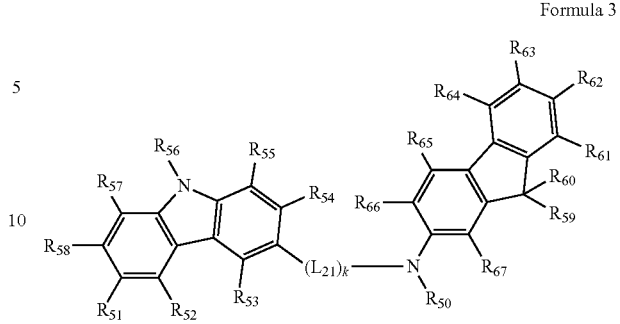

Formula 3

In Formulae 1a to 1c and 2, $R_1$ to $R_{12}$ are each independently a hydrogen atom, a deuterium, a halogen atom, a hydroxyl group, a cyano group, a nitro group, an amino group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, or a substituted or unsubstituted $C_6$-$C_{30}$ aryl group. One of $Ar_1$ and $Ar_2$ is a substituted or unsubstituted $C_6$-$C_{30}$ aryl group, a substituted or unsubstituted $C_6$-$C_{30}$ aryloxy group, or a substituted or unsubstituted $C_6$-$C_{30}$ arylthio group. The other of $Ar_1$ and $Ar_2$ is a substituted or unsubstituted $C_2$-$C_{30}$ heteroaryl group. One or two of $Ar_{11}$, $Ar_{12}$, and $Ar_{13}$ are each independently a substituted or unsubstituted $C_6$-$C_{30}$ aryl group, a substituted or unsubstituted $C_6$-$C_{30}$ aryloxy group, or a substituted or unsubstituted $C_6$-$C_{30}$ arylthio group. The others of $Ar_{11}$, $Ar_{12}$, and $Ar_{13}$ are each independently a substituted or unsubstituted $C_2$-$C_{30}$ heteroaryl group. $L_{11}$, $L_{12}$ and $L_{13}$ are each independently a substituted or unsubstituted $C_6$-$C_{30}$ arylene group. Also, a, b, and c are each independently an integer from 0 to 3.

The metal-containing compound may include an alkali metallic element.

The metal-containing compound may include at least one selected from lithium quinolate (LiQ), lithium fluoride (LiF), or Compound 101 below.

101

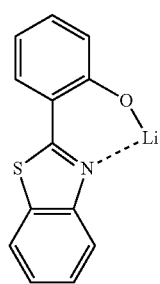

The content of the metal-containing compound may be in the range of 20 to 80 wt % based on the total weight of the electron transport layer.

The phosphorescent emission layer may be a red emission layer.

The organic light-emitting device may further include at least one layer between the first electrode and the phosphorescent emission layer. The at least one layer may be selected from a hole injection layer, a hole transport layer, or a functional layer having both hole injecting and hole transporting capabilities.

The organic light-emitting device may further include a hole transport layer between the first electrode and the phosphorescent emission layer. The hole transport layer may include a compound represented by Formula 3 below.

In Formula 3, $R_{50}$ is a substituted or unsubstituted phenyl group, a substituted or unsubstituted naphthyl group, a substituted or unsubstituted anthryl group, a substituted or unsubstituted biphenyl group, or a substituted or unsubstituted pyridyl group. $L_{21}$ is a substituted or unsubstituted $C_1$-$C_{30}$ alkylene group, a substituted or unsubstituted $C_2$-$C_{30}$ alkenylene group, a substituted or unsubstituted $C_6$-$C_{30}$ arylene group, or a substituted or unsubstituted $C_2$-$C_{30}$ heteroarylene group. $R_{51}$ to $R_{67}$ are each independently a hydrogen atom, a deuterium, a halogen atom, a hydroxyl group, a cyano group, a nitro group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthio group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{30}$ heteroaryl group, or —N($Q_{11}$)($Q_{12}$). $Q_{11}$ and $Q_{12}$ are each independently a hydrogen atom, a deuterium, a halogen atom, a hydroxyl group, a cyano group, an amino group, a nitro group, a carboxyl group, a $C_1$-$C_{30}$ alkyl group, a $C_2$-$C_{30}$ alkenyl group, a $C_2$-$C_{30}$ alkynyl group, a $C_1$-$C_{30}$ alkoxy group, $C_1$-$C_{30}$ alkylthio group, a $C_3$-$C_{30}$ cycloalkyl group, a $C_3$-$C_{30}$ cycloalkenyl group, a $C_6$-$C_{30}$ aryl group, a $C_6$-$C_{30}$ aryloxy group, a $C_6$-$C_{30}$ arylthio group, or a $C_2$-$C_{30}$ heteroaryl group. Also, k is an integer from 0 to 3.

The hole transport layer may further include a charge-generating material. The charge-generating material may include at least one of a quinone derivative, a metal oxide, or a cyano group-containing compound.

The organic light-emitting device may further include a hole injection layer between the first electrode and the hole transport layer. The hole injection layer may include a compound represented by Formula 4 below.

Formula 4

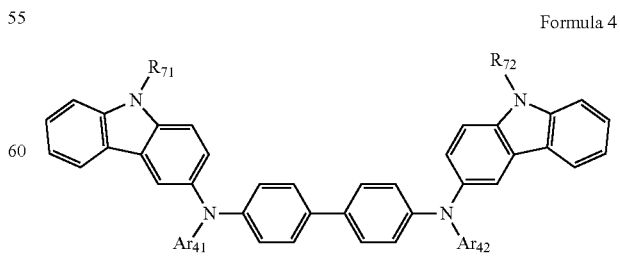

In Formula 4, $Ar_{41}$ and $Ar_{42}$ are each independently a substituted or unsubstituted $C_6$-$C_{30}$ arylene group or a substituted or unsubstituted $C_2$-$C_{30}$ heteroarylene group. $R_{71}$ and $R_{72}$ are each independently a hydrogen atom, a deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_6$-$C_{30}$ aryl group, a substituted or unsubstituted $C_6$-$C_{30}$ aryloxy group, or a substituted or unsubstituted $C_6$-$C_{30}$ arylthio group.

The organic light-emitting device may further include an electron injection layer between the second electrode and the electron transport layer.

According to an aspect of the present invention, an organic light-emitting display apparatus includes the organic light-emitting device and a transistor including a source, a drain, a gate, and an active layer. A first electrode of the organic light-emitting device is electrically connected to the source or the drain of the transistor.

BRIEF DESCRIPTION OF THE DRAWINGS

The above and other features and advantages of the present invention will become more apparent by reference to the following detailed description when considered in conjunction with the attached drawings in which.

DETAILED DESCRIPTION OF THE INVENTION

Hereinafter, the present invention will be described more fully with reference to the accompanying drawings, in which exemplary embodiments of the invention are shown. Expressions such as "at least one of," when preceding a list of elements, modify the entire list of elements and do not modify the individual elements of the list.

Figure 1:
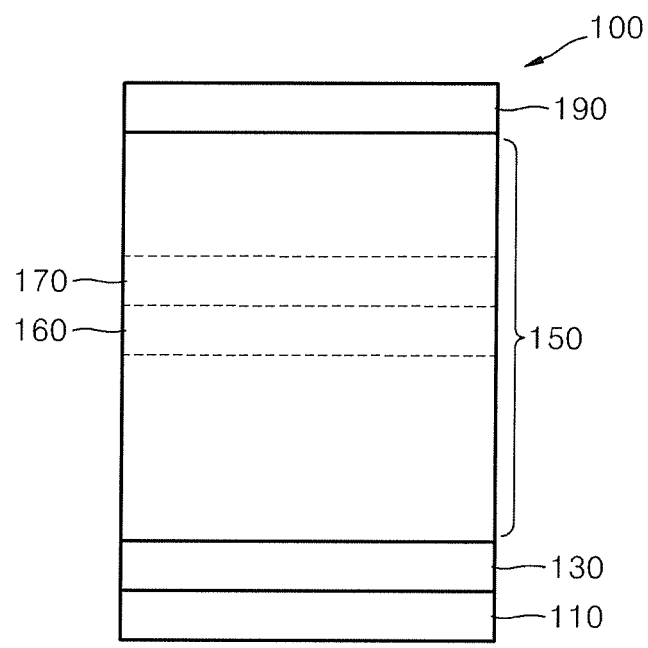
FIG. 1 is a schematic cross-sectional view of an organic light-emitting device according to an embodiment of the present invention.

FIG. 1 is a schematic cross-sectional view of an organic light-emitting device 100 according to an embodiment of the present invention.

Referring to FIG. 1, the organic light-emitting device 100 includes a substrate 110, a first electrode 130 on the substrate 110, a second electrode 190 facing the first electrode 130, and an organic layer 150 between the first electrode 130 and the second electrode 190.

The organic layer 150 includes an emission layer (EML) 160 that emits light when excitons release energy, and an electron transport layer (ETL) 170 between the EML 160 and the second electrode 190 to assist the transport of electrons.

The EML 160 includes a phosphorescent host and dopant which may theoretically improve emission efficiency of the electroluminescent mechanism by up to 4 times that of fluorescent materials. The phosphorescent host may be a compound represented by one of Formulae 1a to 1c below.

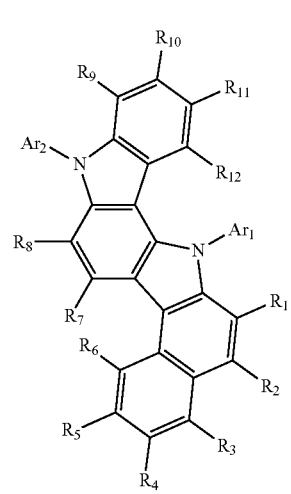

Formula 1a

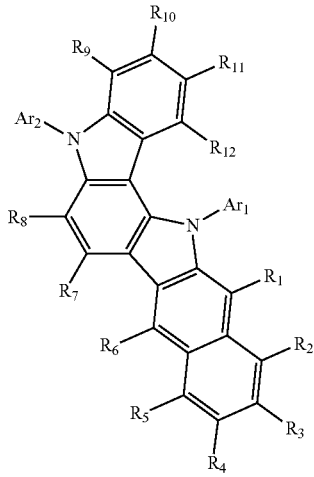

Formula 1b

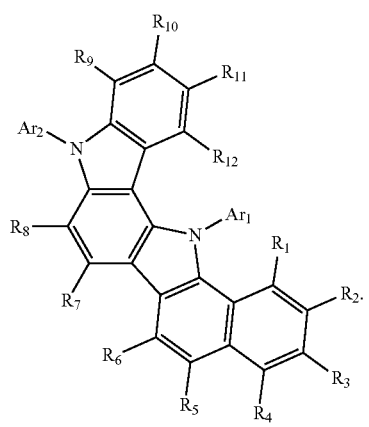

Formula 1c

In Formulae 1a to 1c, $R_1$ to $R_{12}$ are each independently a hydrogen atom, a deuterium, a halogen atom, a hydroxyl group, a cyano group, a nitro group, an amino group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, or a substituted or unsubstituted $C_6$-$C_{30}$ aryl group. One of $Ar_1$ and $Ar_2$ is a substituted or unsubstituted $C_6$-$C_{30}$ aryl group, a substituted or or unsubstituted $C_6$-$C_{30}$ aryloxy group, or a substituted or unsubstituted $C_6$-$C_{30}$ arylthio group. The other of $Ar_1$ and $Ar_2$ is a substituted or unsubstituted $C_2$-$C_{30}$ heteroaryl group.

The compound represented by one of Formulae 1a to 1c includes a substituted or unsubstituted $C_2$-$C_{30}$ heteroaryl group bonded to a carbazole backbone, and an aryl group that does not include a hetero atom (i.e., a substituted or unsubstituted $C_6$-$C_{30}$ aryl group, a substituted or unsubstituted $C_6$-$C_{30}$ aryloxy group, or a substituted or unsubstituted $C_6$-$C_{30}$ arylthio group).

In Formulae 1a to 1c, between $Ar_1$ and $Ar_2$, $Ar_1$ may be a substituted or unsubstituted $C_6$-$C_{30}$ aryl group, a substituted or unsubstituted $C_6$-$C_{30}$ aryloxy group, or a substituted or unsubstituted $C_6$-$C_{30}$ arylthio group. In this case, $Ar_2$ is a substituted or unsubstituted $C_2$-$C_{30}$ heteroaryl group. Conversely, if $Ar_2$ is a substituted or unsubstituted $C_6$-$C_{30}$ aryl group, a substituted or unsubstituted $C_6$-$C_{30}$ aryloxy group, or a substituted or unsubstituted $C_6$-$C_{30}$ arylthio group, then $Ar_1$ is a substituted or unsubstituted $C_2$-$C_{30}$ heteroaryl group.

The ETL 170 includes an ETL-forming material that facilitates the transport of electrons from the second electrode 190 to the EML 160, and a metal-containing compound. The ETL-forming material may be a compound represented by Formula 2 below.

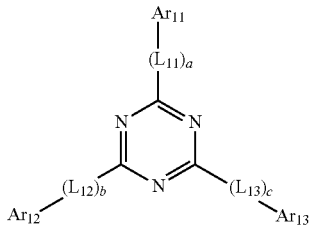

Formula 2

In Formula 2, one or two of $Ar_{11}$, $Ar_{12}$, and $Ar_{13}$ are each independently a substituted or unsubstituted $C_6$-$C_{30}$ aryl group, a substituted or unsubstituted $C_6$-$C_{30}$ aryloxy group, or a substituted or unsubstituted $C_6$-$C_{30}$ arylthio group. The others of $Ar_{11}$, $Ar_{12}$, and $Ar_{13}$ are each independently a substituted or unsubstituted $C_2$-$C_{30}$ heteroaryl group. $L_{11}$, $L_{12}$ and $L_{13}$ are each independently a substituted or unsubstituted $C_6$-$C_{30}$ arylene group. Also, a, b and c are each independently an integer from 0 to 3.

In the compound represented by Formula 2, at least one substituted or unsubstituted $C_2$-$C_{30}$ heteroaryl group is bonded to a triazine backbone, and at least one aryl group that does not have a hetero atom (i.e., a substituted or unsubstituted $C_6$-$C_{30}$ aryl group, a substituted or unsubstituted $C_6$-$C_{30}$ aryloxy group, or a substituted or unsubstituted $C_6$-$C_{30}$ arylthio group) is bonded thereto.

In Formula 2, among $Ar_{11}$, $Ar_{12}$ and $Ar_{13}$, in some embodiments, $Ar_{11}$ may be a substituted or unsubstituted $C_6$-$C_{30}$ aryl group, a substituted or unsubstituted $C_6$-$C_{30}$ aryloxy group, or a substituted or unsubstituted $C_6$-$C_{30}$ arylthio group. In this case, $Ar_{12}$ and $Ar_{13}$ are each independently a substituted or unsubstituted $C_2$-$C_{30}$ heteroaryl group. Similarly, in other embodiments, if $Ar_{12}$ is a substituted or unsubstituted $C_6$-$C_{30}$ aryl group, a substituted or unsubstituted $C_6$-$C_{30}$ aryloxy group, or a substituted or unsubstituted $C_6$-$C_{30}$ arylthio group, $Ar_{11}$ and $Ar_{13}$ are each independently a substituted or unsubstituted $C_2$-$C_{30}$ heteroaryl group. Also, in other embodiments, if $Ar_{13}$ is a substituted or unsubstituted $C_6$-$C_{30}$ aryl group, a substituted or unsubstituted $C_6$-$C_{30}$ aryloxy group, or a substituted or unsubstituted $C_6$-$C_{30}$ arylthio group, $Ar_{11}$ and $Ar_{12}$ are each independently a substituted or unsubstituted $C_2$-$C_{30}$ heteroaryl group.

In some other embodiments, among $Ar_{11}$, $Ar_{12}$, and $Ar_{13}$, $Ar_{11}$ and $Ar_{12}$ may be each independently a substituted or unsubstituted $C_6$-$C_{30}$ aryl group, a substituted or unsubstituted $C_6$-$C_{30}$ aryloxy group, or a substituted or unsubstituted $C_6$-$C_{30}$ arylthio group. In this case, $Ar_{13}$ is a substituted or unsubstituted $C_2$-$C_{30}$ heteroaryl group. Similarly, in other embodiments, if $Ar_{12}$ and $Ar_{13}$ are each independently a substituted or unsubstituted $C_6$-$C_{30}$ aryl group, a substituted or unsubstituted $C_6$-$C_{30}$ aryloxy group, or a substituted or unsubstituted $C_6$-$C_{30}$ arylthio group, then $Ar_{11}$ is a substituted or unsubstituted $C_2$-$C_{30}$ heteroaryl group. In other embodiments, if $Ar_{11}$ and $Ar_{13}$ are each independently a substituted or unsubstituted $C_6$-$C_{30}$ aryl group, a substituted or unsubstituted $C_6$-$C_{30}$ aryloxy group, or a substituted or unsubstituted $C_6$-$C_{30}$ arylthio group, then $Ar_{12}$ is a substituted or unsubstituted $C_2$-$C_{30}$ heteroaryl group.

$L_{11}$, $L_{12}$, and $L_{13}$ are linking groups that link the triazine backbone with $Ar_{11}$, $Ar_{12}$, or $Ar_{13}$, and a, b, and c indicate the number of these linking groups.

If a is 0, -$(L_{11})_a$- indicates a single bond. If a is 2 or greater, the plurality of $L_{11}$ groups may be the same or different from each other. Similarly, if b is 0, -$(L_{12})_b$- indicates a single bond. If b is 2 or greater, the plurality of $L_{12}$ groups may be the same or different from each other. If c is 0, -$(L_{13})_c$- indicates a single bond. If c is 2 or greater, the plurality of $L_{13}$ groups may be the same or different from each other.

The metal-containing compound is a reducible dopant that reduces the compound of Formula 2 to anions to facilitate the injection and transport of electrons from the ETL 170 to the EML 160.

In the compounds represented by Formulae 1a to 1c, in some embodiments, $R_1$ to $R_{12}$ are each independently a hydrogen atom, a deuterium, a substituted or unsubstituted methyl group, a substituted or unsubstituted ethyl group, a substituted or unsubstituted propyl group, a substituted or unsubstituted butyl group, a substituted or unsubstituted phenyl group, a substituted or unsubstituted biphenyl group, a substituted or unsubstituted naphthyl group, a substituted or unsubstituted anthryl group, a substituted or unsubstituted phenanthrenyl group, or a substituted or unsubstituted pyrenyl group. One of $Ar_1$ and $Ar_2$ may be a substituted or unsubstituted phenyl group, a substituted or unsubstituted naphthyl group, a substituted or unsubstituted phenanthrenyl group, a substituted or unsubstituted anthryl group, a substituted or unsubstituted triphenylenyl group, a substituted or unsubstituted pyrenyl group, a substituted or unsubstituted chrysenyl group, a substituted or unsubstituted indenyl group, a substituted or unsubstituted fluorenyl group, or a substituted or unsubstituted fluoranthenyl group. The other of $Ar_1$ and $Ar_2$ may be a substituted or unsubstituted pyrrolyl group, a substituted or unsubstituted imidazolyl group, a substituted or unsubstituted pyrazolyl group, a substituted or unsubstituted pyridinyl group, a substituted or unsubstituted bipyridinyl group, a substituted or unsubstituted pyrazinyl, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted carbazolyl group, a substituted or unsubstituted benzoimidazolyl group, a substituted or unsubstituted triazolyl group, a substituted or unsubstituted tetrazolyl group, a substituted or unsubstituted oxadiazolyl group, a substituted or unsubstituted triazinyl group, or a substituted or unsubstituted benzocarbazolyl group.

According to some embodiments, in the compounds represented by Formulae 1a to 1c, $R_1$ to $R_{12}$ may be each independently a hydrogen atom, a deuterium, a substituted or unsubstituted methyl group, a substituted or unsubstituted ethyl group, a substituted or unsubstituted propyl group, or a substituted or unsubstituted butyl group. One of $Ar_1$ and $Ar_2$ may be a substituted or unsubstituted phenyl group, a substituted or unsubstituted naphthyl group, a substituted or unsubstituted phenanthrenyl group, or a substituted or unsubstituted anthryl group. The other of $Ar_1$ and $Ar_2$ may be a substituted or unsubstituted pyridinyl group, a substituted or unsubstituted pyrazinyl group, a substituted or unsubstituted pyrimidinyl group, or a substituted or unsubstituted pyridazinyl group.

In some embodiments, in the compounds represented by Formulae 1a to 1c, $R_1$ to $R_{12}$ may each be a hydrogen atom. One of $Ar_1$ and $Ar_2$ may be a substituted or unsubstituted phenyl group, and the other of $Ar_1$ and $Ar_2$ may be a substituted or unsubstituted pyrimidinyl group.

In some embodiments, in the compounds represented by Formula 3, one or two of $Ar_{11}$, $Ar_{12}$, and $Ar_{13}$ may be each independently a substituted or unsubstituted phenyl group, a substituted or unsubstituted naphthyl group, a substituted or unsubstituted phenanthrenyl group, a substituted or unsubstituted anthryl group, a substituted or unsubstituted triphenylenyl group, a substituted or unsubstituted pyrenyl group, a substituted or unsubstituted chrysenyl group, a substituted or unsubstituted indenyl group, a substituted or unsubstituted fluorenyl group, or a substituted or unsubstituted fluoranthenyl group. The others of $Ar_{11}$, $Ar_{12}$, and $Ar_{13}$ may be each independently a substituted or unsubstituted pyrrolyl group, a substituted or unsubstituted imidazolyl group, a substituted or unsubstituted pyrazolyl group, a substituted or unsubstituted pyridinyl group, a substituted or unsubstituted bipyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted carbazolyl group, a substituted or unsubstituted benzoimidazolyl group, a substituted or unsubstituted triazolyl group, a substituted or unsubstituted tetrazolyl group, a substituted or unsubstituted oxadiazolyl group, a substituted or unsubstituted triazinyl group, or a substituted or unsubstituted benzocarbazolyl group. $L_{11}$, $L_{12}$, and $L_{13}$ are each independently a substituted or unsubstituted phenylene group, a substituted or unsubstituted naphthylene group, a substituted or unsubstituted phenanthrenylene group, a substituted or unsubstituted anthrylene group, a substituted or unsubstituted triphenylenylene group, a substituted or unsubstituted pyrenylene group, a substituted or unsubstituted chrysenylene group, a substituted or unsubstituted indenylene group, a substituted or unsubstituted fluorenylene group, or a substituted or unsubstituted fluoranthenylene group. Also, a, b, and c are each independently an integer from 0 to 1.

In the compound of Formula 3, one or two of $Ar_{11}$, $Ar_{12}$, and $Ar_{13}$ may be each independently a substituted or unsubstituted phenyl group, a substituted or unsubstituted naphthyl group, a substituted or unsubstituted phenanthrenyl group, or a substituted or unsubstituted anthryl group. The others of $Ar_{11}$, $Ar_{12}$, and $Ar_{13}$ may be each independently a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted quinolinyl group, or a substituted or unsubstituted isoquinolinyl group. $L_{11}$, $L_{12}$ and $L_{13}$ may be each independently a substituted or unsubstituted phenylene group, a substituted or unsubstituted naphthylene group, a substituted or unsubstituted phenanthrenylene group, or a substituted or unsubstituted anthrylene group. Also, a, b, and c may be an integer from 0 to 1.

In some embodiments, in the compound represented by Formula 3, one or two of $Ar_{11}$, $Ar_{12}$, and $Ar_{13}$ may be each independently a substituted or unsubstituted phenyl group, a substituted or unsubstituted naphthyl group, or a substituted or unsubstituted phenanthrenyl group. The others of $Ar_{11}$, $Ar_{12}$, and $Ar_{13}$ may be each independently a substituted or unsubstituted quinolinyl group or a substituted or unsubstituted isoquinolinyl group. $L_{11}$, $L_{12}$, and $L_{13}$ may be a substituted or unsubstituted phenylene group. Also, a, b, and c are each independently an integer from 0 to 1.

For example, in some embodiments, in the compounds represented by Formulae 1a to 1c and Formula 3, $R_1$ to $R_{12}$ may be hydrogen atoms, one of $Ar_1$ and $Ar_2$ may be a substituted or unsubstituted phenyl group, and the other of $Ar_1$ and $Ar_2$ may be a substituted or unsubstituted pyrimidinyl group. Also, one or two of $Ar_{11}$, $Ar_{12}$, and $Ar_{13}$ may be each independently a substituted or unsubstituted phenyl group, a substituted or unsubstituted naphthyl group, or a substituted or unsubstituted phenanthrenyl group. The others of $Ar_{11}$, $Ar_{12}$, and $Ar_{13}$ may be each independently a substituted or unsubstituted quinolinyl group or a substituted or unsubstituted isoquinolinyl group. $L_{11}$, $L_{12}$, and $L_{13}$ are each independently a substituted or unsubstituted phenylene group. Also, a, b and c are each independently an integer from 0 to 1.

In some embodiments, the compound represented by Formulae 1a to 1c may be any compound selected from Compounds 1 to 6 below.

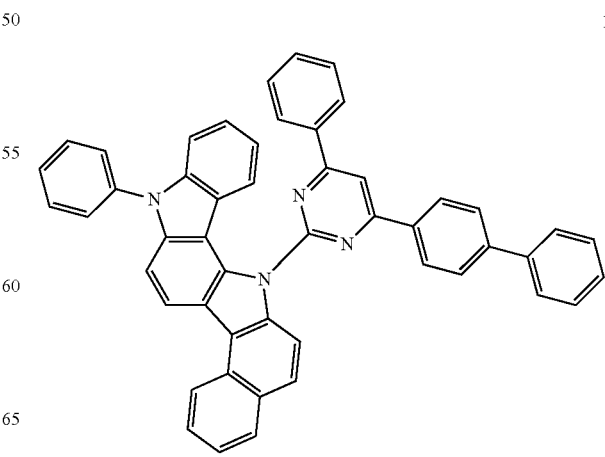

1

2
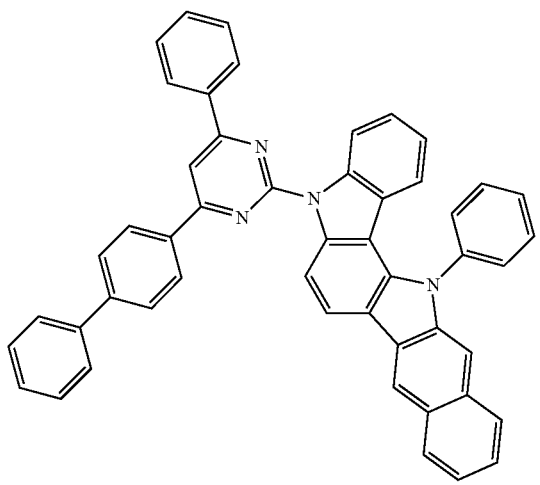
3
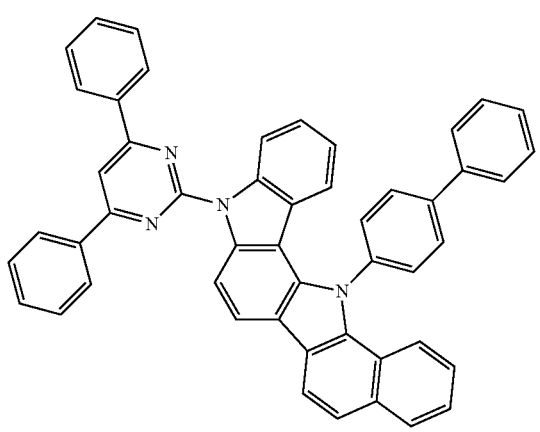
4
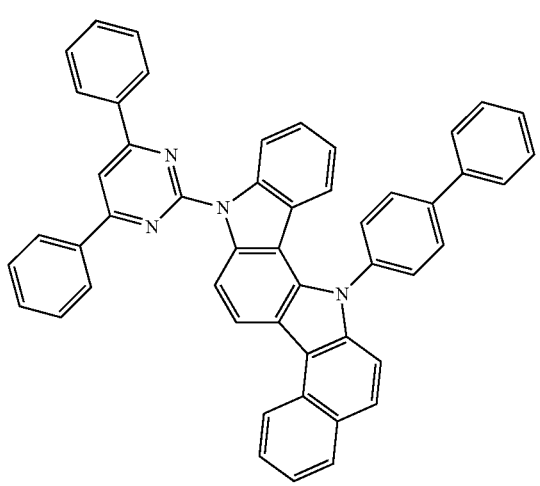
5
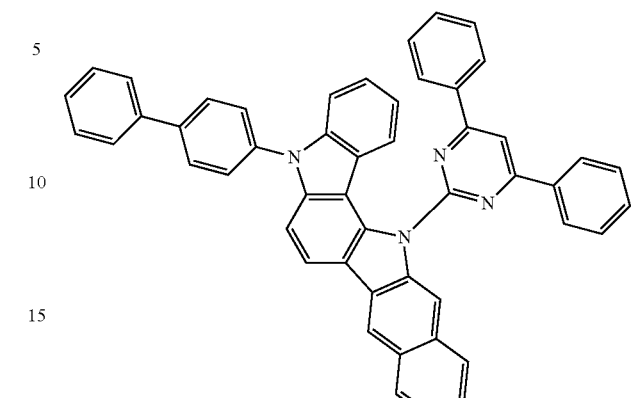
6
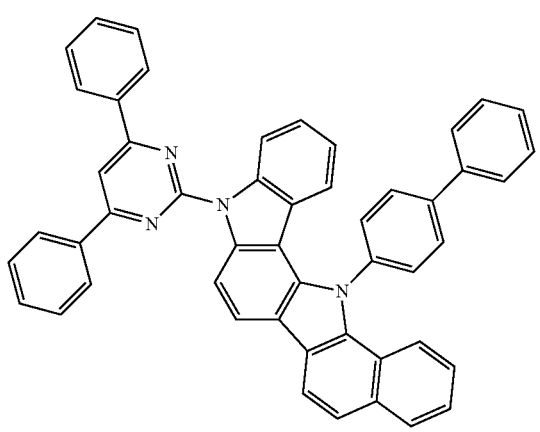
In some embodiments, the compound represented by Formula 3 may be any compound selected from Compounds 11 to 16 below.
11
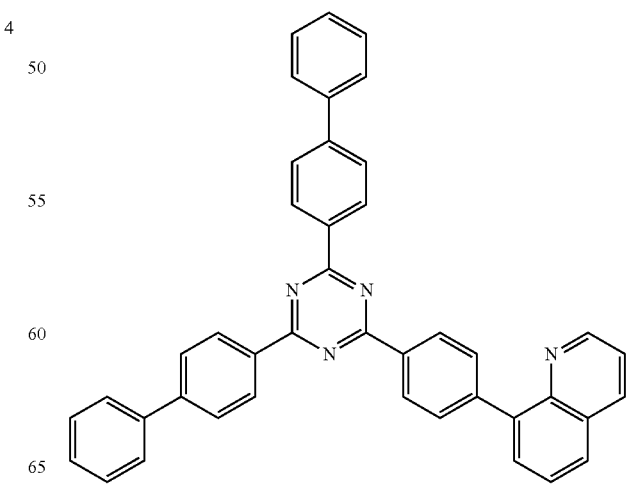

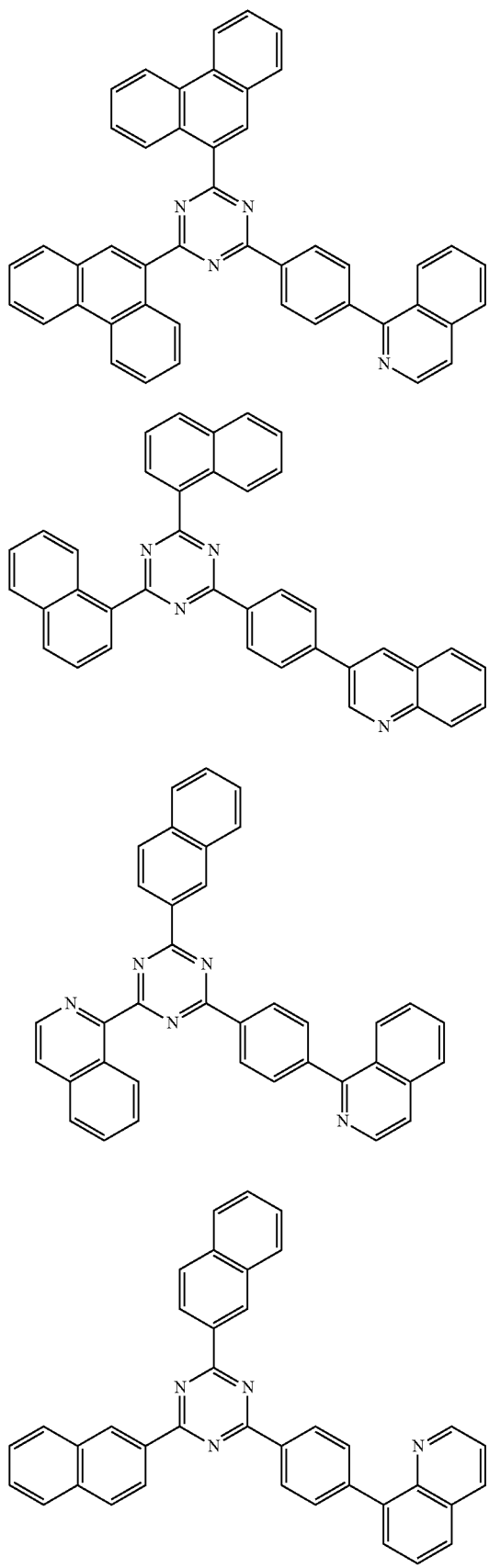

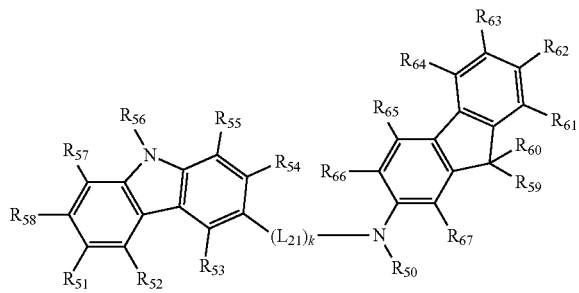

The organic light-emitting device 100 includes a compound represented by one of Formulae 1a to 1c as a host material, and a compound represented by Formula 3 as an ETL-forming material. This makes a desirable combination of the host material, dopant material, and ETL-forming material which improves emission efficiency and cycle life characteristics.

The organic light-emitting device 100 may include a hole injection layer (HIL), a hole transport layer (HTL), and/or a functional layer having both hole injecting and hole transporting capabilities between the first electrode and the EML 160. At least one of the HIL, the HTL, and the functional layer having both hole injecting and hole transporting capabilities facilitates the injection and transport of holes from the first electrode 130 to the EML 160.

The organic light-emitting device 100 includes the HTL between the first electrode and the EML 160. In this case, the HTL may include the compound represented by Formula 3 below.

Formula 3

In Formula 3, $R_{50}$ may be a substituted or unsubstituted phenyl group, a substituted or unsubstituted naphthyl group, a substituted or unsubstituted anthryl group, a substituted or unsubstituted biphenyl group, or a substituted or unsubstituted pyridyl group. $L_{21}$ may be a substituted or unsubstituted $C_1$-$C_{30}$ alkylene group, a substituted or unsubstituted $C_2$-$C_{30}$ alkenylene group, a substituted or unsubstituted $C_6$-$C_{30}$ arylene group, or a substituted or unsubstituted $C_2$-$C_{30}$ heteroarylene group. $R_{51}$ to $R_{67}$ are each independently a hydrogen atom, a deuterium, a halogen atom, a hydroxyl group, a cyano group, a nitro group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{30}$ heteroaryl group, or —$N(Q_{11})(Q_{12})$. $Q_{11}$ and $Q_{12}$ are each independently a hydrogen atom, a deuterium, a halogen atom, a hydroxyl group, a cyano group, an amino group, a nitro group, a carboxyl group, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_1$-$C_{30}$ alkylthiol group, a $C_3$-$C_{30}$ cycloalkyl group, a $C_3$-$C_{30}$ cycloalkenyl group, a $C_6$-$C_{30}$ aryl group, a $C_6$-$C_{30}$ aryloxy group, a $C_6$-$C_{30}$ arylthio group, or a $C_2$-$C_{30}$ heteroaryl group. Also, k is an integer from 0 to 3.

The compound represented by Formula 3 has a high glass transition temperature (Tg) and a high melting point since the compound contains a rigid carbazolyl group and a fluorene group. Thus, the HTL including the compound of Formula 3 has high thermal resistance against Joule's heat generated in the organic layer, between organic layers, or between the organic layer and the metallic electrode when light emission occurs, and has high durability in high-temperature environments, thereby enabling improvements in luminance and cycle life. Particularly, since the HTL is adjacent to the EML 160, concentration quenching (such as the quenching of excitons) may be inhibited at the interface between the HTL and the EML 160, thereby considerably improving the emission efficiency of the organic light-emitting device 100.

The organic light-emitting device 100 may include a HTL between the first electrode 130 and the HTL. In this case, the HTL may include a compound represented by Formula 4 below.

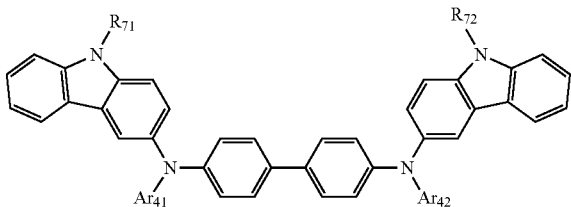

Formula 4

In Formula 4, $Ar_{41}$ and $Ar_{42}$ are each independently a substituted or unsubstituted $C_6$-$C_{30}$ arylene group or a substituted or unsubstituted $C_2$-$C_{30}$ heteroarylene group. $R_{71}$ and $R_{72}$ are each independently a hydrogen atom, a deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_6$-$C_{30}$ aryl group, a substituted or unsubstituted $C_6$-$C_{30}$ aryloxy group, or a substituted or unsubstituted $C_6$-$C_{30}$ arylthio group.

The compound represented by Formula 4 has a high glass transition temperature (Tg) and a high melting point since the compound contains at least two rigid carbazolyl groups. Thus, the HIL including the compound of Formula 4 has high thermal resistance against Joule's heat generated in the organic layer, between organic layers, or between the organic layer and the metallic electrode when light emission occurs, and has high durability in high-temperature environments, thereby enabling improvements in luminance and cycle life.

The organic light-emitting device 100 may include an electron injection layer (EIL) between the second electrode 190 and the HTL 170. The EIL facilitates the injection of electrons from the second electrode 190 to the EML 160.

Hereinafter, the organic light-emitting device 100 and a method of fabricating the organic light-emitting device 100 will be described with reference to FIG. 1.

A substrate 110 is provided, which may be any substrate commonly used in organic light-emitting devices. For example, the substrate may be a glass substrate or a transparent plastic substrate with good mechanical strength, thermal stability, transparency, surface smoothness, ease of handling, and waterproofness.

A first electrode 130 may be formed on the substrate 110 by depositing or sputtering a material used to form the first electrode 130. When the first electrode 130 is an anode, the material used to form the first electrode 130 may be a high work-function material so as to facilitate hole injection. The first electrode 130 may be a reflective electrode or a transmissive electrode. Transparent and conductive materials such as indium tin oxide (ITO), indium zinc oxide (IZO), tin oxide ($SnO_2$), and zinc oxide (ZnO) may be used to form the first electrode 130. The first electrode 130 may be formed as a reflective electrode using magnesium (Mg), silver (Ag), aluminum (Al), aluminum-lithium (Al—Li), calcium (Ca), silver/indium tin oxide (Ag/ITO), magnesium-indium (Mg—In), magnesium-silver (Mg—Ag), or the like. The first electrode 130 may have a single-layered or a multi-layered structure. For example, the first electrode 130 may have a triple-layered structure of ITO/Ag/ITO, but is not limited thereto.

An organic layer 150 is formed on the first electrode 130. The organic layer 150 may include an HIL (not shown), an HTL (not shown), a buffer layer (not shown), an EML 160, an ETL 170, and an EIL (not shown).

The HIL may be formed on the first electrode 130 by vacuum deposition, spin coating, casting, LB deposition, or the like. When the HIL is formed using vacuum deposition, the deposition conditions may vary according to the compound used to form the HIL, and the desired structural and thermal characteristics of the HIL to be formed. For example, the deposition conditions may include a deposition temperature of 100 to 500° C., a vacuum pressure of $10^{-8}$ to $10^{-3}$ torr, and a deposition rate of 0.01 to 100 Å/sec, but are not limited thereto. When the HIL is formed using spin coating, the coating conditions may vary according to the compound used to form the HIL, and the desired structural and thermal properties of the HIL to be formed. For example, the coating conditions may include a coating speed of about 2000 rpm to about 5000 rpm, and a thermal treatment temperature of about 80° C. to about 200° C., where the thermal treatment removes the solvent after coating.

The HIL-forming material may be a compound represented by Formula 4 below, but is not limited thereto.

Formula 4

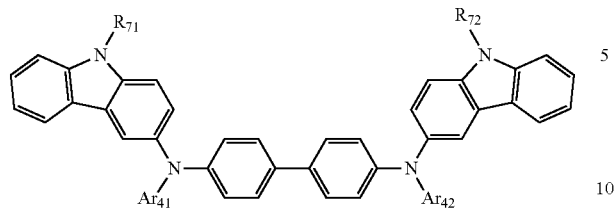

In Formula 4, $Ar_{41}$ and $Ar_{42}$ are each independently a substituted or unsubstituted $C_6$-$C_{30}$ arylene group or a substituted or unsubstituted $C_2$-$C_{30}$ heteroarylene group. $R_{71}$ and $R_{72}$ are each independently a hydrogen atom, a deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_6$-$C_{30}$ aryl group, a substituted or unsubstituted $C_6$-$C_{30}$ aryloxy group, or a substituted or unsubstituted $C_6$-$C_{30}$ arylthio group.

Examples of the HIL-forming material include compounds represented by Formula 4 and mixtures of compounds of Formula 4 and any known hole injecting materials.

The compound represented by Formula 4 may be any compound selected from Compounds 301 to 308 below, but is not limited thereto.

301

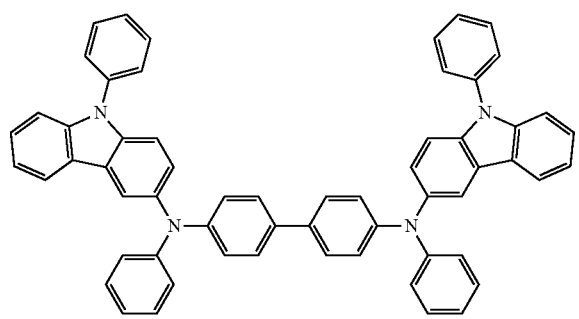

302

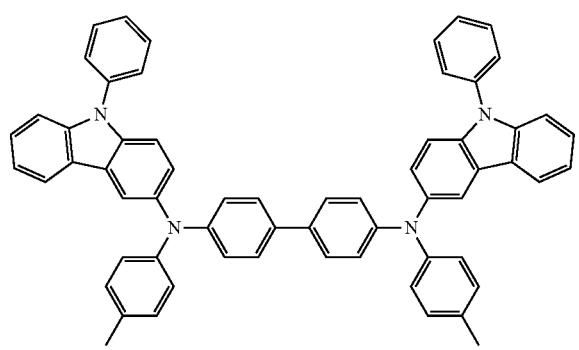

303

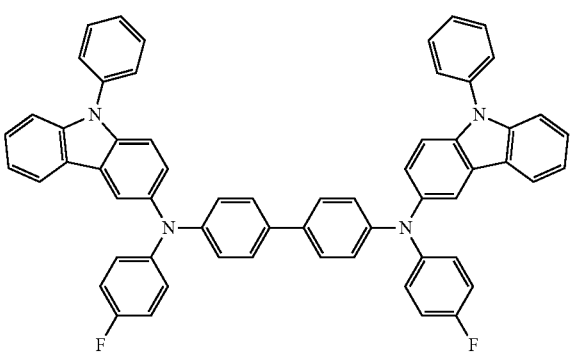

304

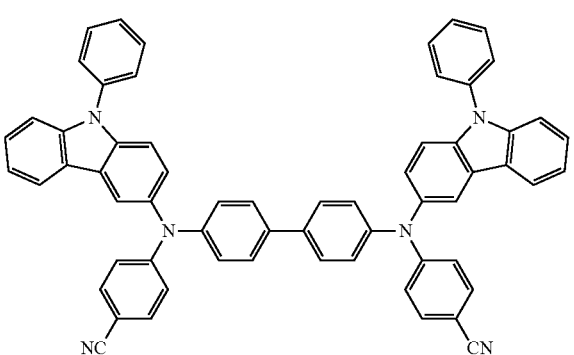

305

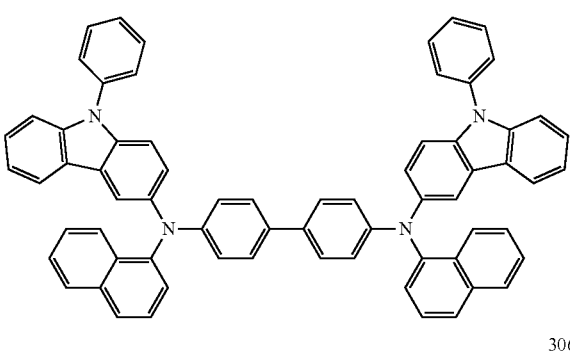

306

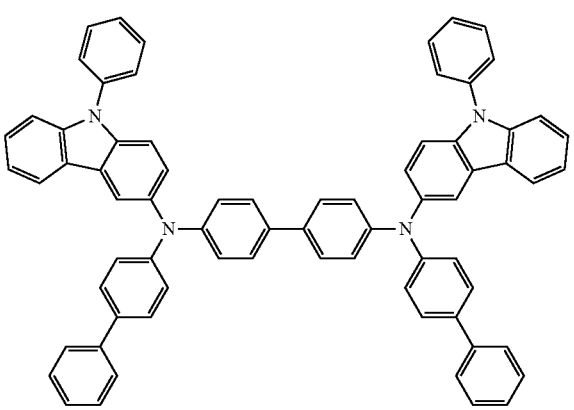

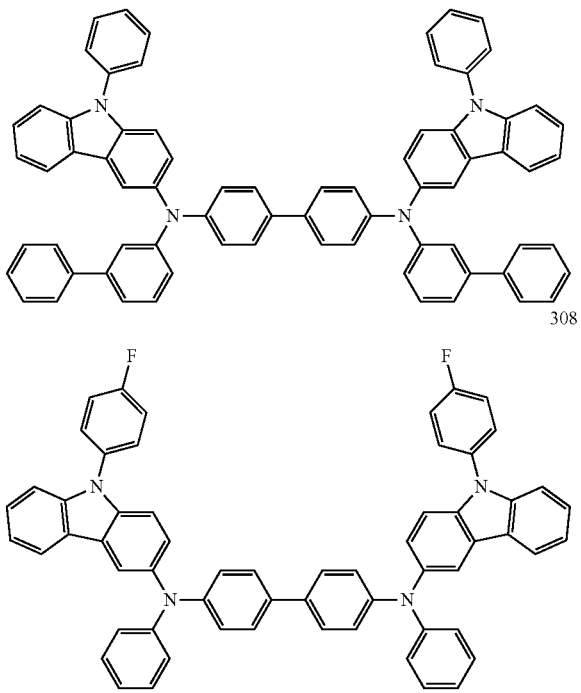

Examples of known hole injecting materials include, but are not limited to, N,N'-diphenyl-N,N'-bis-[4-(phenyl-m-tolyl-amino)-phenyl]biphenyl-4,4'-diamine (DNTPD), phthalocyanine compounds such as copperphthalocyanine, 4,4',4''-tris (3-methylphenylphenylamino)triphenylamine (m-MTDATA), N,N'-di(1-naphthyl)-N,N'-diphenylbenzidine (NPB), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), and (polyaniline)/poly(4-styrenesulfonate) (PANI/PSS).

The thickness of the HIL may be about 100 to about 10,000 Å, and for example, about 100 to about 1,000 Å. When the thickness of the HIL is within these ranges, the HIL may have good hole injecting ability without substantially increasing driving voltage.

The HTL may be formed on the HIL by vacuum deposition, spin coating, casting, LB deposition, or the like. When the HTL is formed by vacuum deposition or spin coating, the conditions for the deposition or coating may be similar to those for the formation of the HIL, although the conditions for the deposition or coating may vary according to the compound used to form the HTL.

The HTL-forming material may be a compound represented by Formula 3 below, but is not limited thereto.

In Formula 3, $R_{50}$ is a substituted or unsubstituted phenyl group, a substituted or unsubstituted naphthyl group, a substituted or unsubstituted anthryl group, a substituted or unsubstituted biphenyl group, or a substituted or unsubstituted pyridyl group. $L_{21}$ is a substituted or unsubstituted $C_1$-$C_{30}$ alkylene group, a substituted or unsubstituted $C_2$-$C_{30}$ alkenylene group, a substituted or unsubstituted $C_6$-$C_{30}$ arylene group, or a substituted or unsubstituted $C_2$-$C_{30}$ heretoarylene group. $R_{51}$ to $R_{67}$ are each independently a hydrogen atom, a deuterium, a halogen atom, a hydroxyl group, a cyano group, a nitro group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthio group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{30}$ heteroaryl group, or —$N(Q_{11})(Q_{12})$. Also, k is an integer from 0 to 3.

In —$N(Q_{11})(Q_{12})$, $Q_{11}$ and $Q_{12}$ are each independently a hydrogen atom, a deuterium, a halogen atom, a hydroxyl group, a cyano group, an amino group, a nitro group, a carboxyl group, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_1$-$C_{30}$ alkylthio group, a $C_3$-$C_{30}$ cycloalkyl group, a $C_3$-$C_{30}$ cycloalkenyl group, a $C_6$-$C_{30}$ aryl group, a $C_6$-$C_{30}$ aryloxy group, a $C_6$-$C_{30}$ arylthio group, or a $C_2$-$C_{30}$ heteroaryl group.

In Formula 3, if k is 0, -$(L_{21})_k$-indicates a single bond. If k is 2 or greater, the plurality of $L_{21}$ groups may be the same or different from each other.

Examples of the HTL-forming material may include compounds represented by Formula 3 or mixtures of compounds of Formula 3 and any known hole transporting materials.

The compound represented by Formula 3 may be any compound selected from Compounds 309 to 320 below, but is not limited thereto.

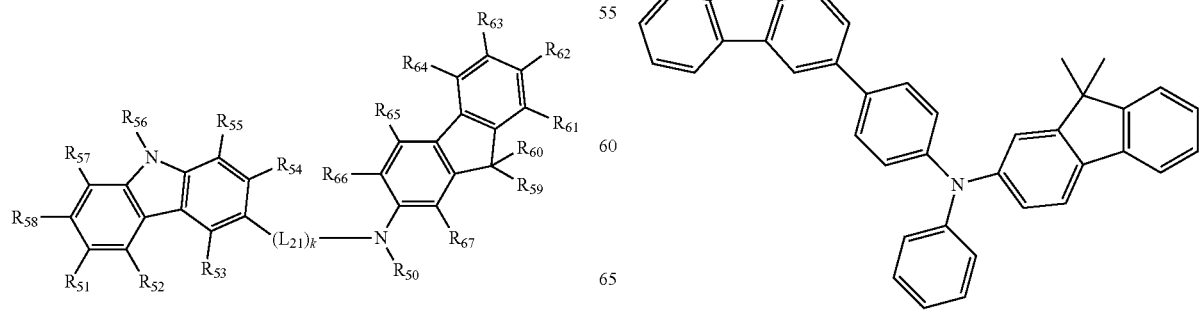

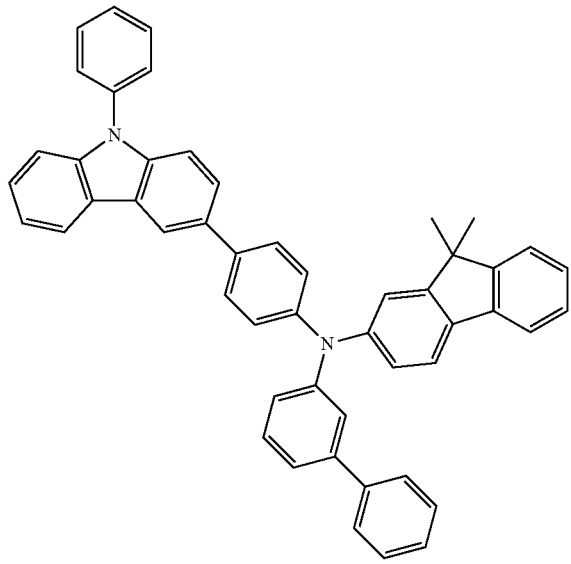
310
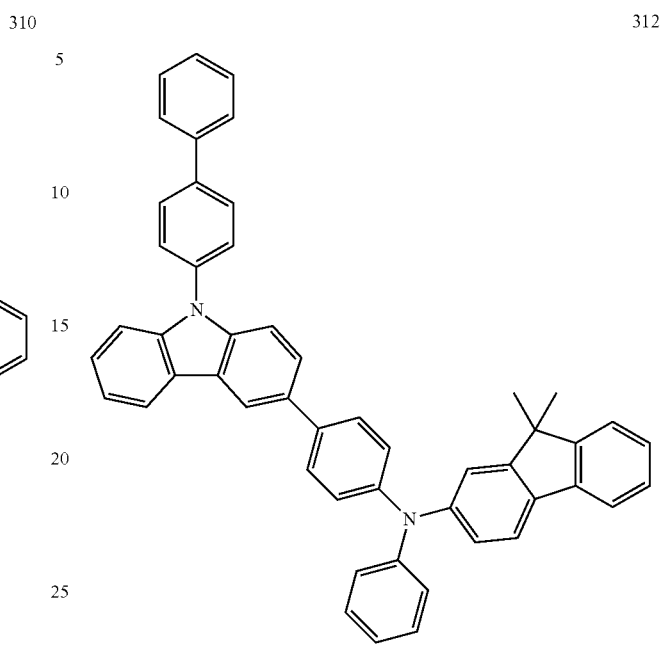
312
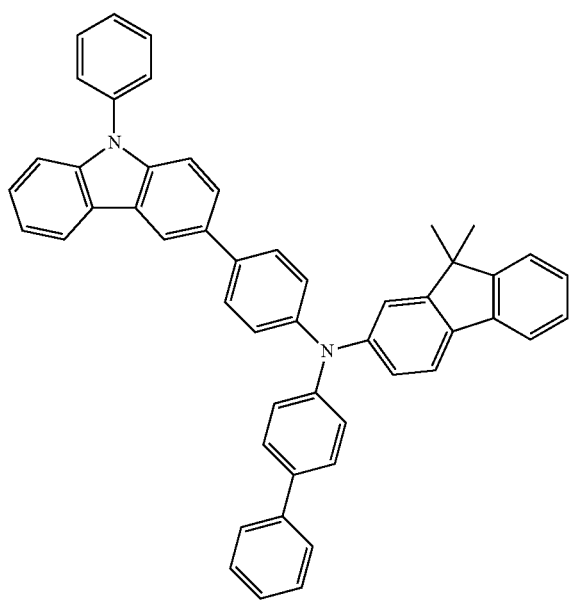
311
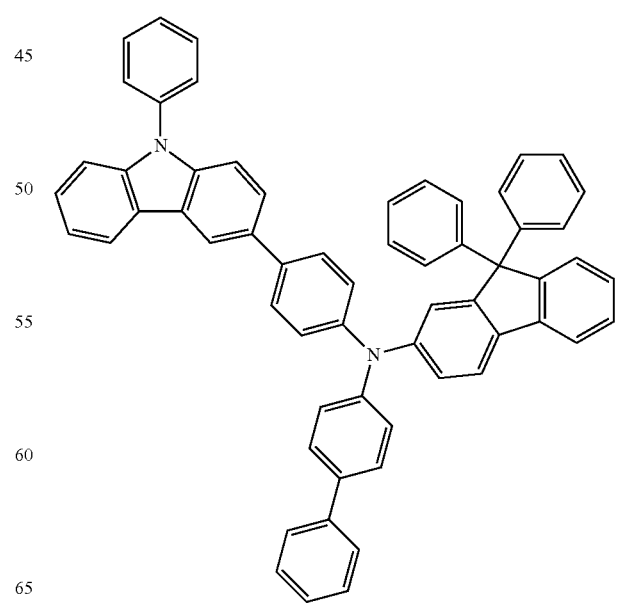
313

314
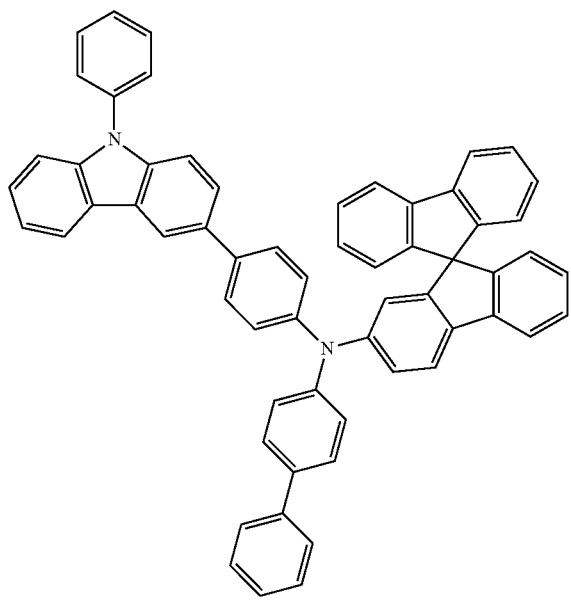
315
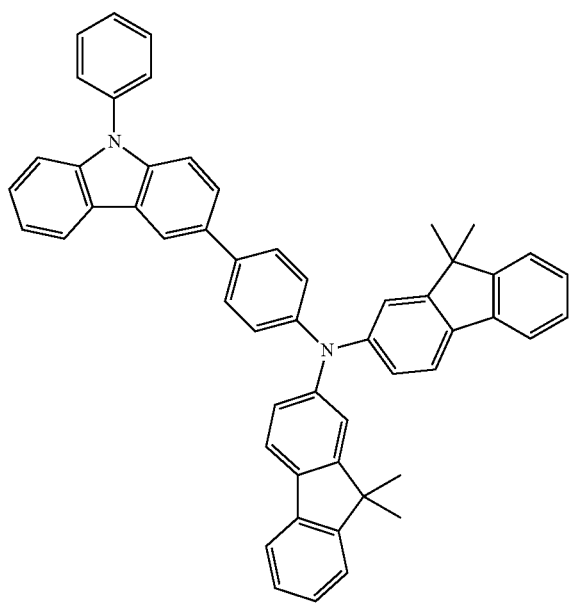
316
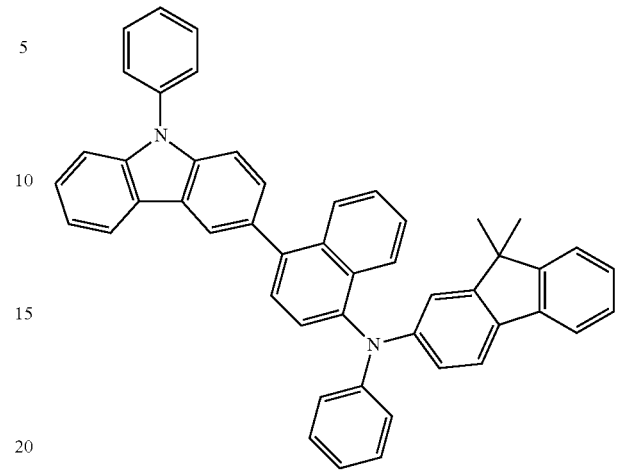
317
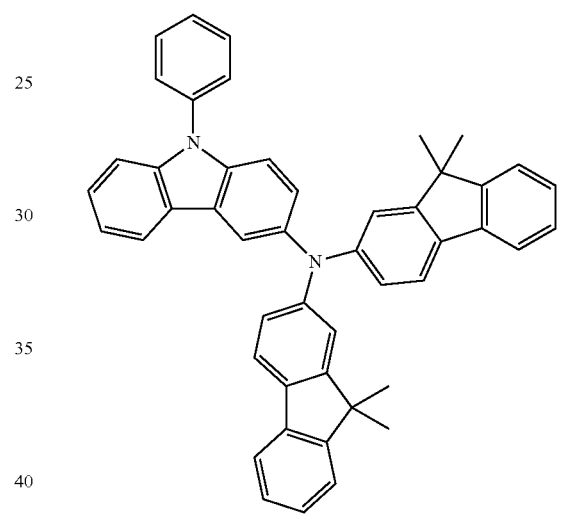
318
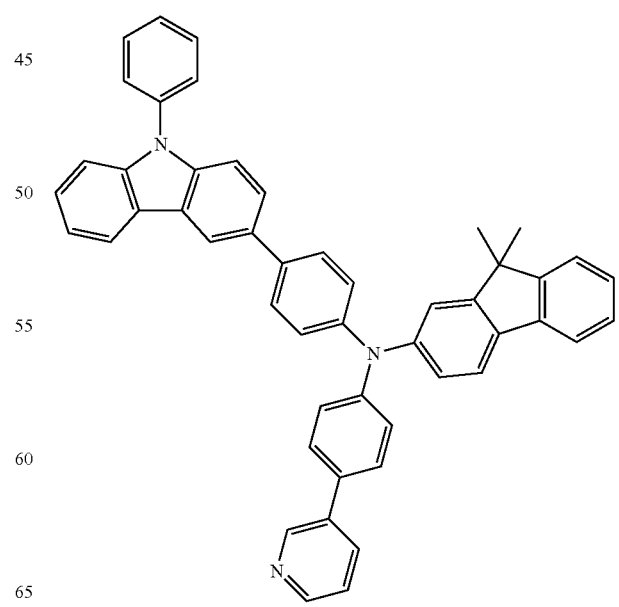

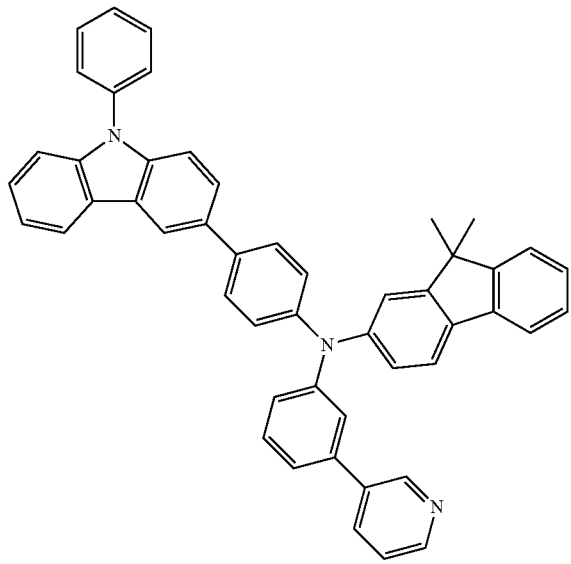

319

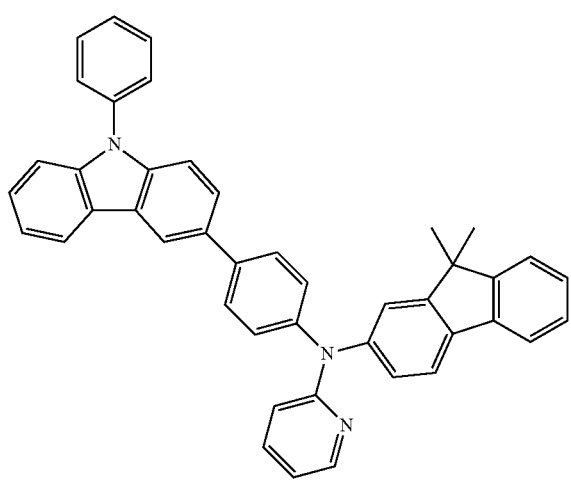

320

Examples of the known hole transporting material include carbazole derivatives such as N-phenylcarbazole and polyvinyl carbazole, N,N'-bis(3-methylphenyl)-N,N'-diphenyl-[1,1-biphenyl]-4,4'-diamine (TPD), 4,4',4''-tris(N-carbazolyl)triphenylamine (TCTA), and N,N'-di(1-naphthyl)-N,N'-diphenylbenzidine (NPB), but are not limited thereto.

The HTL may further include a charge-generating material. The charge-generating material may include at least one of a quinone derivative, a metal oxide, or a cyano group-containing compound. Examples of the metal oxide include molybdenum oxide and vanadium oxide. Due to strong acceptability, the charge-generating material may facilitate the injection and transport of holes.

The thickness of the HTL may be in a range of about 50 to about 2,000 Å, for example, about 100 to about 1,500 Å. When the thickness of the HTL is within these ranges, the HTL may have good hole transporting ability without substantially increasing driving voltage.

On the first electrode 130, only one of the HIL and HTL is formed and the other may not be formed. Alternatively, at least one of the HIL and HTL may be formed on the first electrode 130 in a single layer or in multiple layers. Alternatively, a functional layer having both hole injecting and hole transporting capabilities may be formed on the first electrode 130 instead of the HIL and the HTL. The functional layer having both hole injecting and hole transporting capabilities may include at least one selected from compounds of Formula 3, mixtures of a compound of Formula 3 and a hole transporting material, a compound represented by Formula 4, and mixtures of a compound of Formula 4 and a hole injecting material. The thickness of the functional layer having both hole injecting and hole transporting capabilities may be about 500 Å to about 10,000 Å, for example, about 100 Å to about 1,000 Å. When the thickness of the functional layer having both hole injecting and hole transporting capabilities is within these ranges, good hole injecting and transporting abilities may be obtained without substantially increasing driving voltage.

The EML 160 may be formed on the HTL or the functional layer having both hole injecting and hole transporting capabilities by vacuum deposition, spin coating, casting, LB deposition, or the like. When the EML 160 is formed using vacuum deposition or spin coating, the deposition or coating conditions may be similar to those for formation of the HIL, although the deposition or coating conditions may vary according to the compound used to form the EML 160.

Examples of the host material of the EML 160 may include compounds represented by Formulae 1a through 1c.

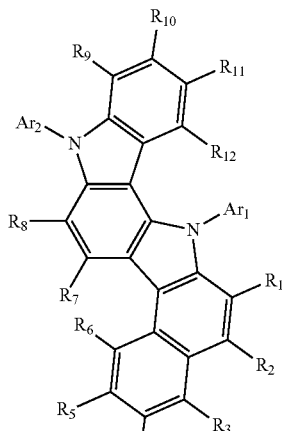

Formula 1a

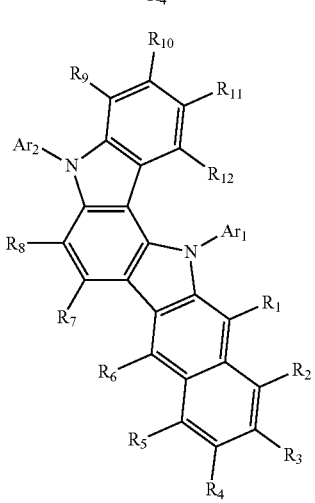

Formula 1b

Formula 1c

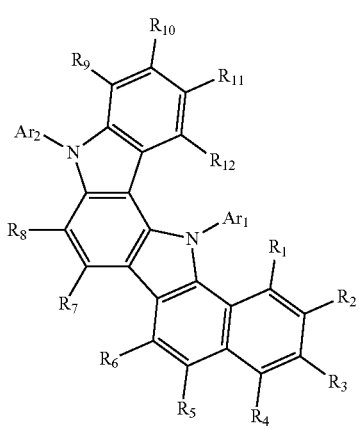

In Formulae 1a to 1c, $R_1$ to $R_{12}$, $Ar_1$, $Ar_2$, $Ar_{11}$, $Ar_{12}$, $Ar_{13}$, $L_{11}$, $L_{12}$, $L_{13}$, a, b, and c are defined as described above.

The EML 160 may be patterned as a red EML. The EML 160 includes the host material and a dopant material (ppy=phenylpyridine).

The following compounds may be used as a red dopant, but the red dopant is not limited thereto.

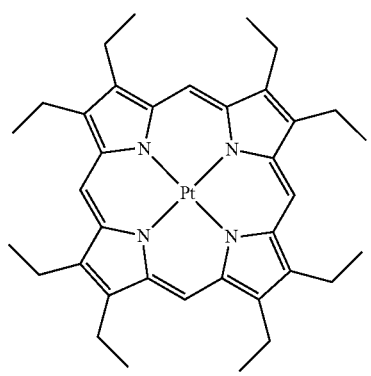
PtOEP

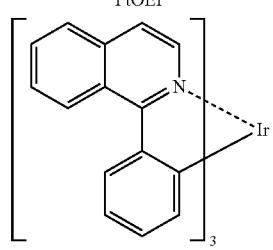
Ir(piq)$_3$

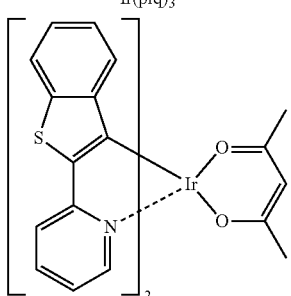
Btp$_2$Ir(acac)

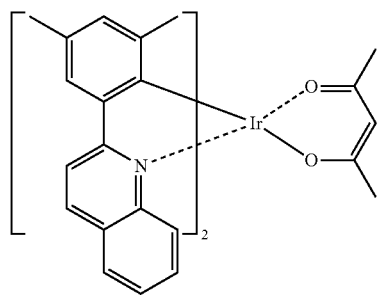
Ir(pq)$_2$(acac)

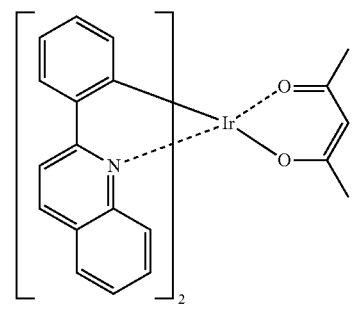

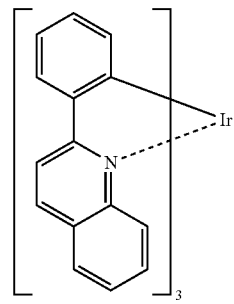
Ir(2-phq)$_3$

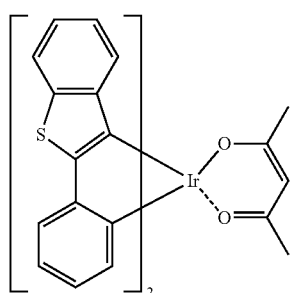
Ir(BT)$_2$(acac)

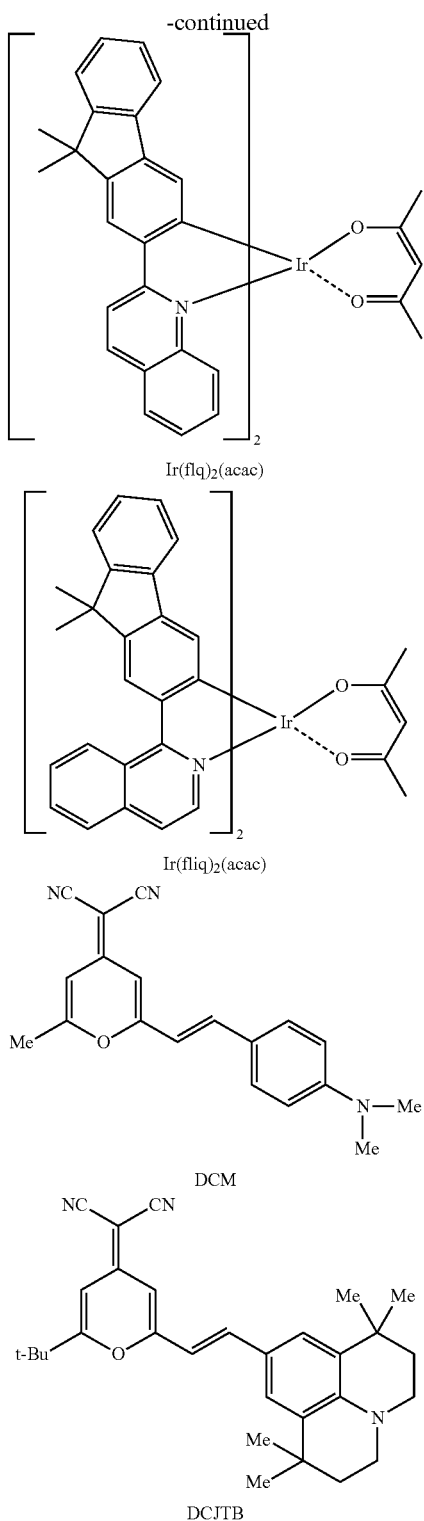

Ir(flq)₂(acac)

Ir(fliq)₂(acac)

DCM

DCJTB

The content of the dopant material contained in the EML 160 may be about 0.01 to about 15 parts by weight based on 100 parts by weight of the host material.

The thickness of the EML 160 may be in the range of about 100 Å to about 1000 Å, for example, about 200 Å to about 600 Å. When the thickness of the EML 160 is within these ranges, the EML 160 may have good light emitting ability without substantially increasing driving voltage.

Then, the ETL 170 may be formed on the EML 160 by vacuum deposition, spin coating, casting, or the like. When the ETL 170 is formed using vacuum deposition or spin coating, the deposition or coating conditions may be similar to those for formation of the HIL, although the deposition or coating conditions may vary according to the compound used to form the ETL 170. The ETL 170 includes an ETL-forming material and a metal-containing material. The ETL-forming material may be a material that can stably transport electrons injected from the electron injecting electrode (cathode), and a compound represented by Formula 2 below may be used.

Formula 2

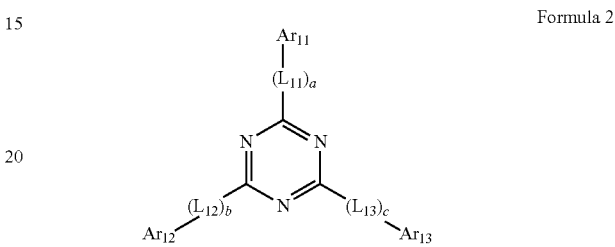

In Formula 2, $Ar_{11}$, $Ar_{12}$, $Ar_{13}$, $L_{11}$, $L_{12}$, $L_{13}$, a, b, and c are defined as described above.

The thickness of the ETL 170 may be about 100 Å to about 1000 Å, for example, about 150 Å to about 500 Å. When the thickness of the ETL 170 is within these ranges, the ETL 170 may have good electron transporting ability without substantially increasing driving voltage.

The metal-containing compound is a reducible dopant that reduces the compound of Formula 2 to anions to facilitate injection and transport of electrons, and may include an alkali metallic element. The alkali metallic element may be Li.

The metal-containing compound may include at least one of lithium quinolate (LiQ), lithium fluoride (LiF), or Compound 101 below.

Compound 101

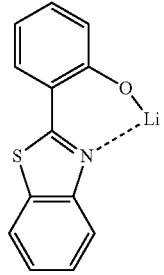

The content of the metal-containing compound may be 20 to 80 wt % based on the total weight of the ETL 170. When the content of the metal-containing compound is within this range, good electron injecting and transporting abilities may be obtained without substantially increasing driving voltage.

An EIL that facilitates injection of electrons from the cathode may be formed on the ETL 170 using any electron injecting material.

Examples of EIL-forming materials include LiF, NaCl, CsF, $Li_2O$, and BaO. The conditions for deposition of the EIL are similar to those for formation of the HIL, although the deposition conditions may vary according to the compound used to form the EIL.

The thickness of the EIL may be about 1 to about 100 Å, for example, about 3 to about 90 Å. When the thickness of the EIL is within these ranges, the EIL may have good electron transporting ability without substantially increasing driving voltage.

The second electrode 190 is formed on the organic layer 150. The second electrode 190 may be a cathode, which is an electron injecting electrode. A material used to form the second electrode 190 may be a metal, an alloy, an electrically conductive compound, or a mixture thereof, all of which have a low work function. For example, the second electrode 190 may be a transmissive electrode formed of a thin film of lithium (Li), magnesium (Mg), aluminum (Al), an Al:Li alloy, calcium (Ca), a Mg:In alloy, or a Mg:Ag alloy. In order to manufacture a top-emission type organic light-emitting device, a transmissive electrode formed of ITO or IZO may be used, and various modifications may be applied thereto.

In the organic light-emitting device 100 including the structure described above, good emission efficiency and a long cycle life are achieved by desirably combining a host material, a dopant material, and an ETL-forming material in the EML 160 and the ETL 170.

An organic light-emitting display apparatus according to another embodiment of the present invention includes the organic light-emitting device described above, and a transistor that includes a source, a drain, a gate, and an active layer. The first electrode of the organic light-emitting device is electrically connected to one of the source or the drain of the transistor.

The active layer of the transistor may be an amorphous silicon layer, a crystalline silicon layer, an organic semiconductor layer, an oxide semiconductor layer, or the like.

The organic light-emitting display apparatus has high light-emitting efficiency and a long cycle life.

Examples of the unsubstituted $C_1$-$C_{30}$ alkyl group (or $C_1$-$C_{30}$ alkyl group) used herein include a linear or branched alkyl group such as methyl, ethyl, propyl, isobutyl, sec-butyl, pentyl, iso-amyl, and hexyl. The substituted $C_1$-$C_{30}$ alkyl group is obtained by substituting at least one hydrogen atom of the unsubstituted $C_1$-$C_{30}$ alkyl group with a deuterium, a halogen atom, a hydroxyl group, a nitro group, a cyano group, an amino group, an amidino group, hydrazine, hydrazone, a carboxyl group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, a $C_6$-$C_{30}$ aryl group, a $C_2$-$C_{30}$ heteroaryl group, —N($Q_{101}$)($Q_{102}$), or Si($Q_{103}$)($Q_{104}$)($Q_{105}$)($Q_{106}$)-. $Q_{101}$ to $Q_{106}$ are each independently a hydrogen atom, a $C_1$-$C_{30}$ alkyl group, a $C_2$-$C_{30}$ alkenyl group, a $C_2$-$C_{30}$ alkynyl group, a $C_6$-$C_{30}$ aryl group, or a $C_2$-$C_{30}$ heteroaryl group.

The unsubstituted $C_1$-$C_{30}$ alkoxy group (or $C_1$-$C_{30}$ alkoxy group) used herein may be represented by —OA, where A is an unsubstituted $C_1$-$C_{30}$ alkyl group. Examples of the $C_1$-$C_{30}$ alkoxy group include methoxy, ethoxy, or isopropyloxy. At least one hydrogen atom of the $C_1$-$C_{30}$ alkoxy group may be substituted with the same substituent groups described above with reference to the $C_1$-$C_{30}$ alkyl group.

The unsubstituted $C_2$-$C_{30}$ alkenyl group (or $C_2$-$C_{30}$ alkenyl group) used herein refers to a hydrocarbon chain having at least one carbon-carbon double bond within or at a terminal end of the unsubstituted $C_2$-$C_{30}$ alkyl group. Examples of the $C_2$-$C_{30}$ alkenyl group include ethenyl, propenyl, and butenyl. To obtain the substituted $C_2$-$C_{30}$ alkenyl group, at least one hydrogen atom of the unsubstituted $C_2$-$C_{30}$ alkenyl group may be substituted with the same substituent groups described above with reference to the $C_1$-$C_{30}$ alkyl group.

The unsubstituted $C_2$-$C_{30}$ alkynyl group (or $C_2$-$C_{30}$ alkynyl group) used herein refers to a hydrocarbon chain having at least one carbon-carbon triple bond within or at a terminal end of the unsubstituted $C_2$-$C_{30}$ alkyl group. Examples of the $C_2$-$C_{30}$ alkenyl group include ethynyl and propynyl. To obtain the substituted $C_2$-$C_{30}$ alkynyl group, at least one hydrogen atom in the unsubstituted $C_2$-$C_{30}$ alkynyl group may be substituted with the same substituent groups described above with reference to the $C_1$-$C_{30}$ alkyl group.

The unsubstituted $C_6$-$C_{30}$ aryl group used herein refers to a monovalent group having a $C_6$-$C_{30}$ carbocyclic aromatic system including at least one aromatic ring. The unsubstituted $C_6$-$C_{30}$ arylene group used herein refers to a divalent group having a $C_6$-$C_{30}$ carbocyclic aromatic system including at least one aromatic ring. If the aryl group or arylene group include at least two rings, they may be fused to each other. The substituted $C_6$-$C_{30}$ aryl group is prepared by substituting at least one hydrogen atom in the $C_6$-$C_{30}$ aryl group with the same substituent groups described above with reference to the $C_1$-$C_{30}$ alkyl group. The substituted $C_6$-$C_{30}$ arylene group is prepared by substituting at least one hydrogen atom in the $C_6$-$C_{30}$ arylene group with the same substituent groups described above with reference to the $C_1$-$C_{30}$ alkyl group.

The unsubstituted $C_2$-$C_{30}$ heteroaryl group is a monovalent group having at least one aromatic ring having at least one heteroatom selected from N, O, P, and S and 2 to 30 carbon atoms. The unsubstituted $C_2$-$C_{30}$ heteroarylene group is a divalent group having at least one aromatic ring having at least one heteroatom selected from N, O, P, and S and 2 to 30 carbon atoms. When the $C_2$-$C_{30}$ heteroaryl group and the $C_2$-$C_{30}$ heteroarylene group have at least two rings, they may be fused to each other. The substituted $C_2$-$C_{30}$ heteroaryl group is prepared by substituting at least one hydrogen atom in the $C_2$-$C_{30}$ heteroaryl group with the same substituent groups described above with reference to the $C_1$-$C_{30}$ alkyl group. The substituted $C_2$-$C_{30}$ heteroarylene group is prepared by substituting at least one hydrogen atom in the $C_2$-$C_{30}$ heteroarylene group with the same substituent groups described above with reference to the $C_1$-$C_{30}$ alkyl group.

The unsubstituted $C_6$-$C_{30}$ aryloxy group is represented by —O$A_2$, where $A_2$ is a substituted or unsubstituted $C_6$-$C_{30}$ aryl group. The substituted $C_6$-$C_{30}$ aryloxy group is prepared by substituting at least one hydrogen atom in the $C_6$-$C_{30}$ aryloxy group with the same substituent groups described above with reference to the $C_1$-$C_{30}$ aryl group.

The unsubstituted $C_6$-$C_{30}$ arylthio group is represented by —S$A_3$, where $A_3$ is a substituted or unsubstituted $C_6$-$C_{30}$ aryl group. The substituted $C_6$-$C_{30}$ arylthio group is prepared by substituting at least one hydrogen atom in the $C_6$-$C_{30}$ arylthio group with the same substituent groups described above with reference to the $C_1$-$C_{30}$ aryl group.

Hereinafter, one or more embodiments will be described with reference to the following examples. These examples are presented for illustrative purposes only and do not limit the purpose and/or scope of the one or more embodiments of the present invention.

Example 1

An anode was prepared by cutting an ITO(7 nm)/Ag(100 nm)/ITO(7 nm) substrate (manufactured by Samsung Mobile Display using Corning glass) to a size of 50 mm×50 mm×0.7 mm, ultrasonically cleaning the substrate using pure water and isopropyl alcohol for 30 minutes each, and then irradiating with UV light and ozone for 10 minutes to clean. Then, the substrate was disposed in a vacuum deposition apparatus.

Compound 301 was vacuum deposited on the glass substrate to form an HIL having a thickness of 750 Å, and then Compound 311 was vacuum deposited on the HIL to form an HTL having a thickness of 1300 Å.

Compound 5, as a host, and Compound 501, as a dopant, were simultaneously deposited on the HTL in a weight ratio of 98:2 to form a red EML with a thickness of 400 Å.

Then, Compound 11 and LiQ were vacuum deposited in a weight ratio of 50:50 on the EML to form an ETL having a thickness of 100 Å.

LiQ was vacuum-deposited on the ETL to form an EIL with a thickness of 5 Å, and Mg:Ag were vacuum-deposited in a weight ratio of 10:1 to form a cathode with a thickness of 130 Å, thereby completing the manufacture of an organic light-emitting device.

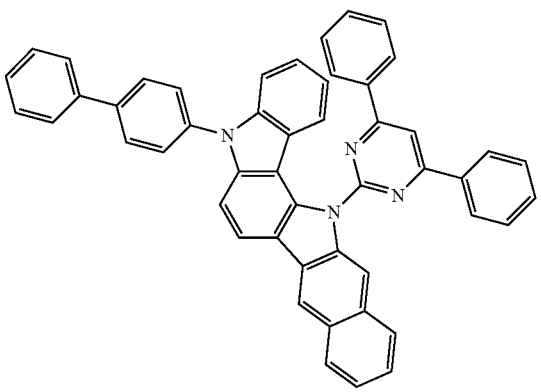

5

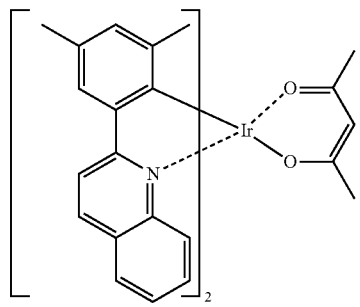

501

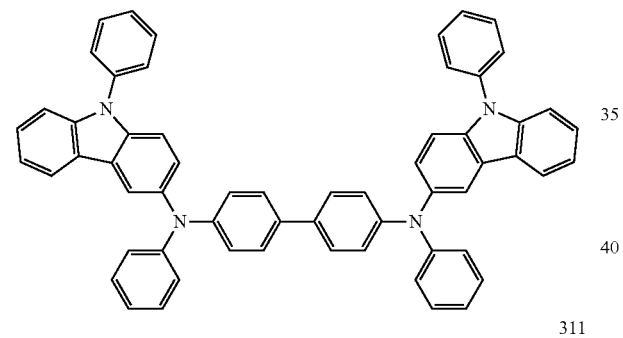

301

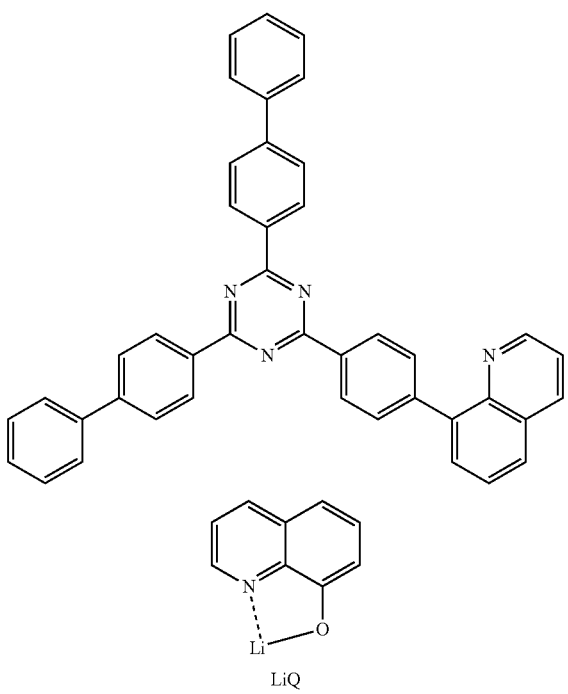

11

LiQ

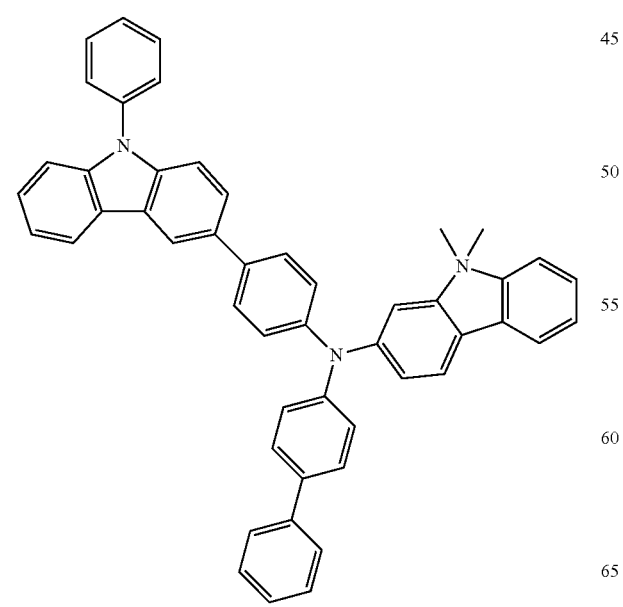

311

Example 2

An organic light-emitting device was manufactured as in Example 1, except that Compound 15 was used instead of Compound 11 in forming the ETL.

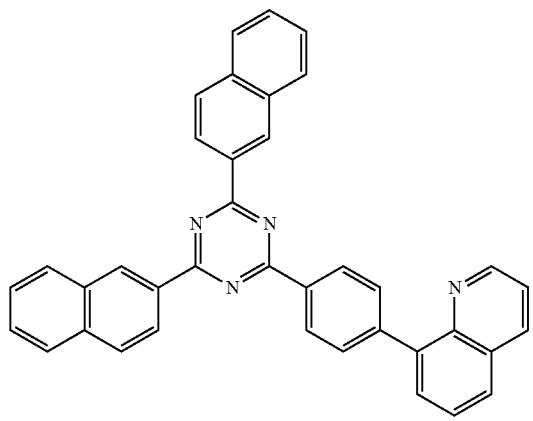

Example 3

An organic light-emitting device was manufactured as in Example 1, except that Compound 12 was used instead of Compound 11 in forming the ETL.

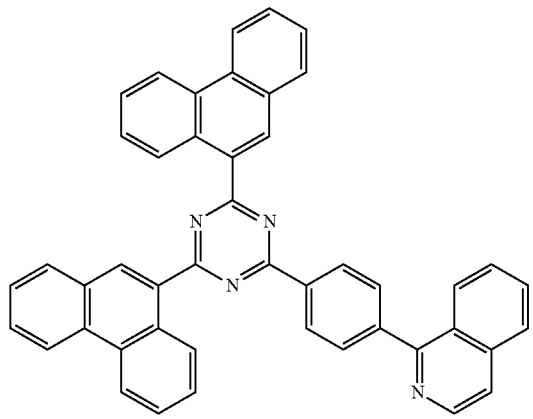

Example 4

An organic light-emitting device was manufactured as in Example 1, except that Compound 4 was used instead of Compound 5 in forming the EML, and Compound 15 was used instead of Compound 11 in forming the ETL.

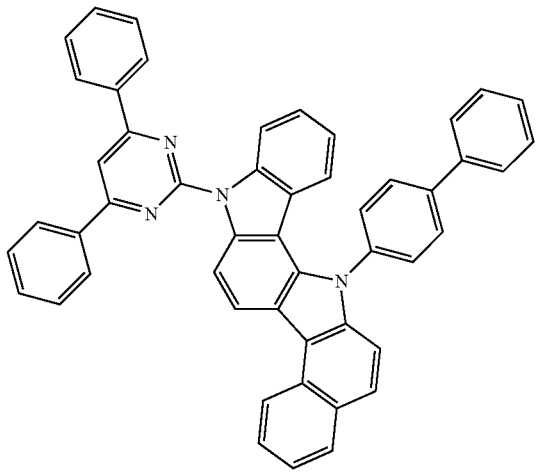

Example 5

An organic light-emitting device was manufactured as in Example 1, except that Compound 3 was used instead of Compound 5 in forming the EML, and Compound 15 was used instead of Compound 11 in forming the ETL.

Example 6

An organic light-emitting device was manufactured as in Example 1, except that Compound 2 was used instead of Compound 5 in forming the EML, and Compound 15 was used instead of Compound 11 in forming the ETL.

2

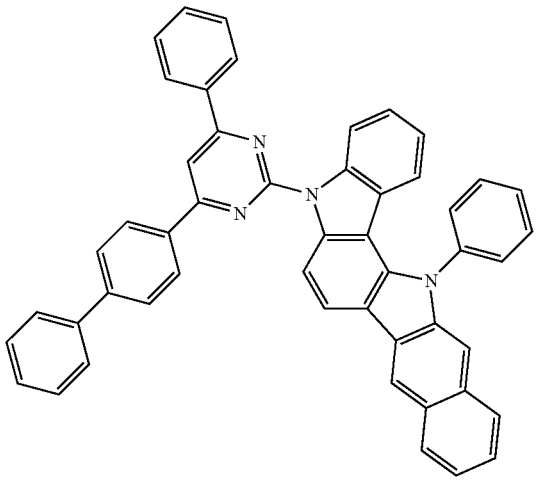

Comparative Example 1

An organic light-emitting device was manufactured as in Example 1, except that Compound 601 was used instead of Compound 5 in forming the EML, and Compound 602 was used instead of Compound 11 in forming the ETL.

601

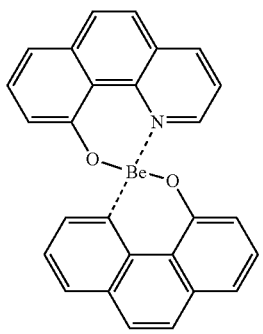

602

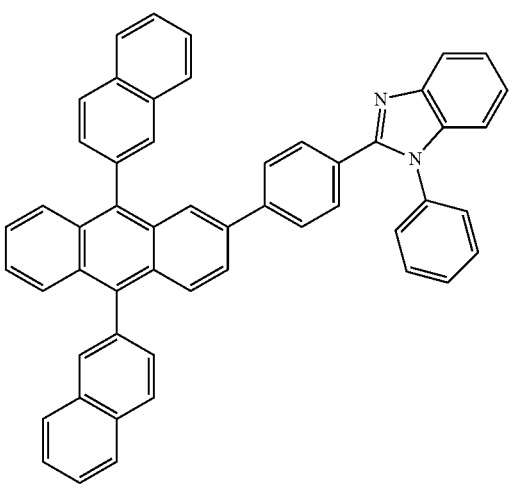

Comparative Example 2

An organic light-emitting device was manufactured as in Example 1, except that Compound 601 was used instead of Compound 5 in forming the EML, and Compound 15 was used instead of Compound 11 in forming the ETL.

Evaluation Example

Driving voltage, light emission efficiency, and the color coordinates of the organic light-emitting devices prepared according to Examples 1 to 6 and Comparative Examples 1 and 2 were evaluated using a PR650 (Spectroscan) and a Source Measurement Unit (PhotoResearch), and the results are shown in Table 1 below.

TABLE 1

| | Driving voltage (V) | Current density (mA/cm$^2$) | Current efficiency (cd/A) | Power efficiency (lm/W) | CIE_x | CIE_y |
|---|---|---|---|---|---|---|
| Example 1 | 4.4 | 11.4 | 32.4 | 23.1 | 0.659 | 0.339 |
| Example 2 | 4.0 | 12.3 | 30.1 | 23.5 | 0.654 | 0.344 |
| Example 3 | 4.3 | 10.3 | 36.0 | 26.1 | 0.648 | 0.350 |
| Example 4 | 4.0 | 10.6 | 35.0 | 27.2 | 0.649 | 0.349 |
| Example 5 | 3.9 | 11.8 | 31.3 | 24.9 | 0.647 | 0.350 |
| Example 6 | 3.9 | 12.0 | 30.8 | 24.7 | 0.649 | 0.349 |
| Comparative Example 1 | 5.2 | 10.8 | 34.3 | 20.6 | 0.674 | 0.324 |
| Comparative Example 2 | 4.3 | 10.3 | 36.0 | 26.3 | 0.671 | 0.327 |

Referring to Table 1, the driving voltages of the organic light-emitting devices prepared according to Examples 1 to 6 were lower than that of the organic light-emitting device prepared in Comparative Example 1 by about 0.9 to 1.2 V. As a result, it was confirmed that the power efficiency of each of the devices prepared in Examples 1 to 6 was greater than that in Comparative Example 1 by about 15 to 30%. Meanwhile, the power efficiency of each of the organic light-emitting devices prepared according to Examples 1 to 6 was similar to that of the organic light-emitting device prepared in Comparative Example 2.

Figure 2:
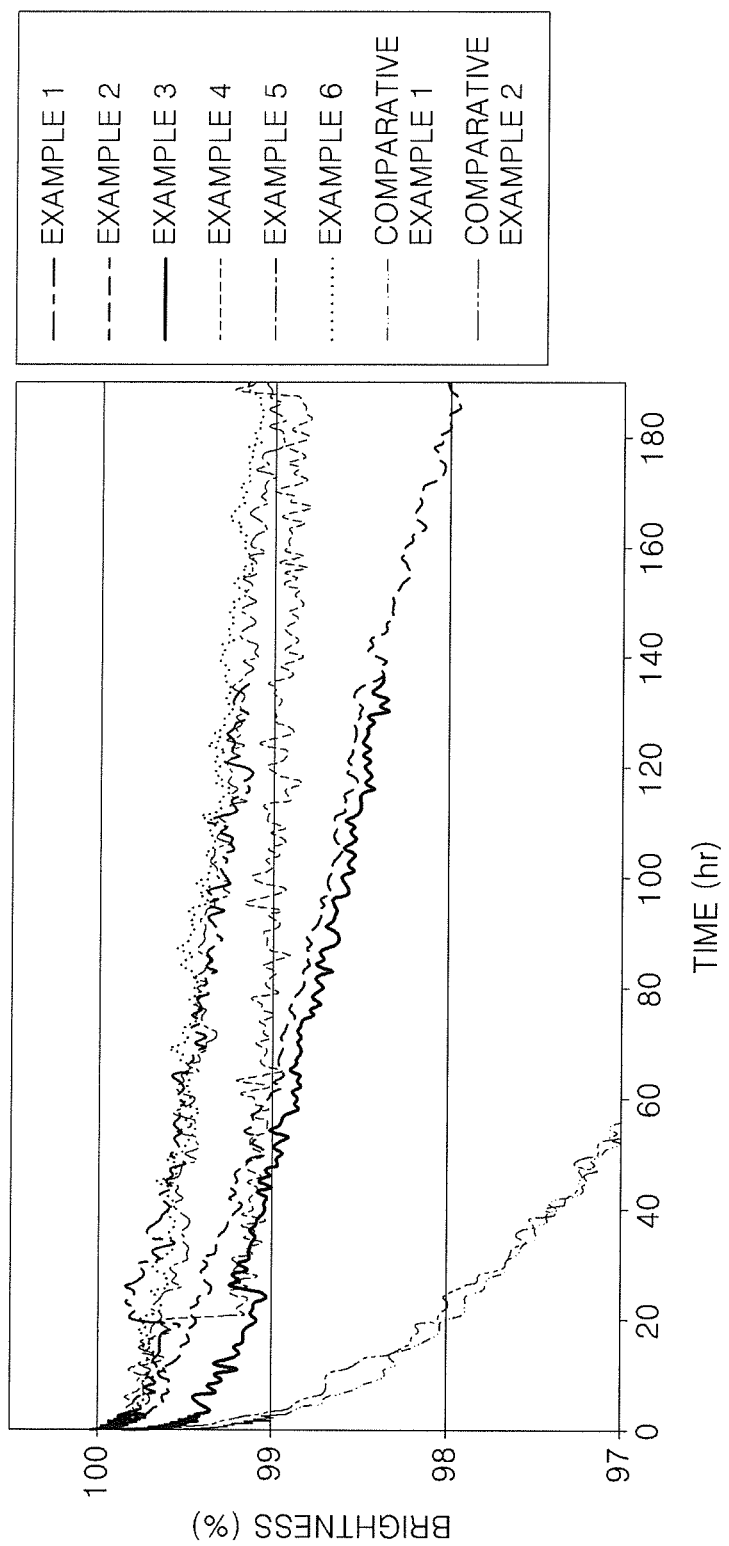
FIG. 2 is a graph of the cycle life of an organic light-emitting device according to an embodiment of the present invention.

The luminance of red emission (%) according to time of each of the organic light-emitting devices prepared in Examples 1 to 6 and Comparative Examples 1 and 2 was measured at 3,700 cd/m$^2$, and the results are shown in FIG. 2.

Referring to FIG. 2, it took about 180 hours for the luminance of the organic light-emitting devices prepared in Examples 1 to 6 to reach 99%, and it took about 40 to 60 hours for the luminance of the organic light-emitting devices prepared in Comparative Examples 1 and 2 to reach 99%. Therefore, the cycle life (99% luminance) of the organic light-emitting devices prepared in Examples 1 to 6 was far longer than those of the organic light-emitting devices prepared in Comparative Examples 1 and 2 (i.e., by about 3 times or greater).

Figure 3:
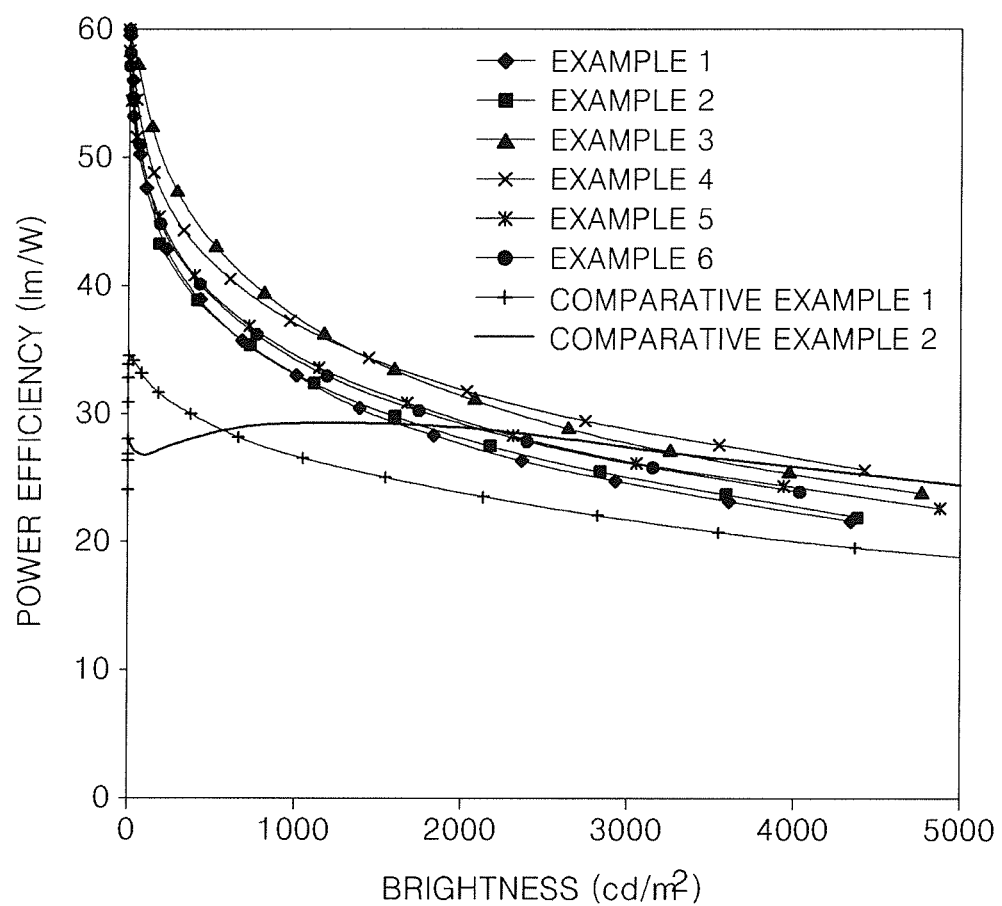
FIG. 3 is a graph of the emission efficiency of an organic light-emitting device according to an embodiment of the present invention.

The power efficiency of each of the organic light-emitting devices prepared in Examples 1 to 6 and Comparative Examples 1 and 2 was measured while changing the luminance between 0.1 cd/m$^2$ to 5,000 cd/m$^2$, and the results are shown in FIG. 3.

Referring to FIG. 3, the power efficiency of each of the organic light-emitting devices prepared according to Examples 1 to 6 was far greater than that of the organic light-emitting device prepared in Comparative Example 1.

Meanwhile, the power efficiency of each of the organic light-emitting devices prepared according to Examples 1 to 6 was similar to that of the organic light-emitting device prepared in Comparative Example 2 at high luminance.

In conclusion, the organic light-emitting devices prepared according to Examples 1 to 6 have lower driving voltage, and higher power efficiency than the device of Comparative Example 1, and longer cycle life than the device of Comparative Example 2.

Therefore, it was identified that the red phosphorescent organic light-emitting device according to embodiments of the present invention had high emission efficiency and long cycle life.

The organic light-emitting devices according to embodiments of the present invention have high emission efficiency and long cycle life, which are achieved by desirably combining a host material, a dopant material, and an ETL-forming material.

The organic light-emitting display apparatus according to other embodiments of the present invention have high emission efficiency and long cycle life, which are achieved by including the organic light-emitting device.

While the present invention has been illustrated and described with reference to certain exemplary embodiments, those of ordinary skill in the art will understand that various changes and modifications can be made to the described embodiments without departing from the spirit and scope of the present invention as defined by the following claims.

What is claimed is:

1. An organic light-emitting device comprising:
    a first electrode, a second electrode facing the first electrode, a phosphorescent emission layer between the first electrode and the second electrode, and an electron transport layer between the phosphorescent emission layer and the second electrode,
    wherein:
        the phosphorescent emission layer comprises a compound represented by one of Formulae 1a to 1c, and
        the electron transport layer comprises a metal-containing compound and a compound represented by Formula 2:

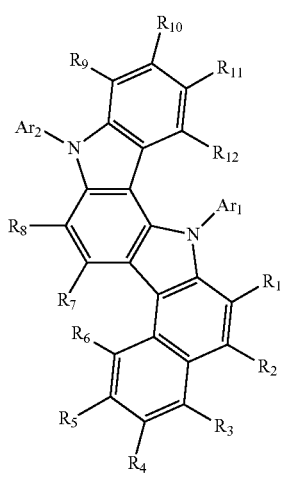

Formula 1a

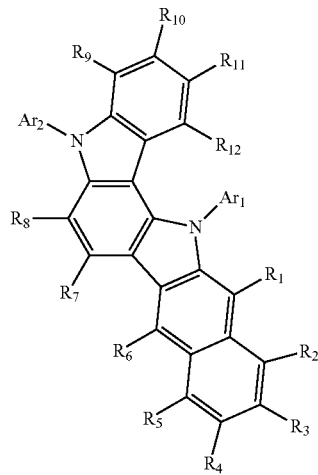

Formula 1b

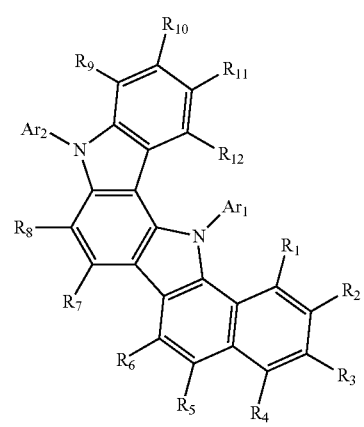

Formula 1c

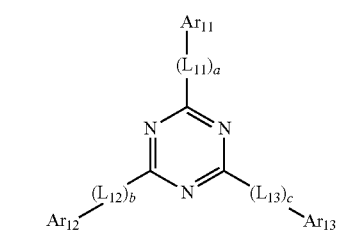

Formula 2 wherein:
$R_1$ to $R_{12}$ are each independently a hydrogen atom, a deuterium, a halogen atom, a hydroxyl group, a cyano group, a nitro group, an amino group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, or a substituted or unsubstituted $C_6$-$C_{30}$ aryl group;
one of $Ar_1$ or $Ar_2$ is a substituted or unsubstituted $C_6$-$C_{30}$ aryl group, a substituted or unsubstituted $C_6$-$C_{30}$ aryloxy group, or a substituted or unsubstituted $C_6$-$C_{30}$ arylthio group, and the other of $Ar_1$ and $Ar_2$ is a substituted or unsubstituted $C_2$-$C_{30}$ heteroaryl group;
one or two of $Ar_{11}$, $A_{12}$, or $Ar_{13}$ are each independently an unsubstituted phenyl group, a substituted or unsubstituted $C_7$-$C_{30}$ aryl group, a substituted or unsubstituted $C_6$-$C_{30}$ aryloxy group, or a substituted or unsubstituted $C_6$-$C_{30}$ arylthio group, and the others of $Ar_{11}$, $A_{12}$, and $Ar_{13}$ are each independently a substituted or unsubstituted pyrrolyl group, a substituted or unsubstituted imidazolyl group, a substituted or unsubstituted pyrazolyl group, a substituted or unsubstituted bipyridinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted isoquinolinyl group, a substituted or unsubstituted benzoquinolinyl group, a substituted or unsubstituted carbazolyl group, a substituted or unsubstituted benzoimidazolyl group, a substituted or unsubstituted triazolyl group, a substituted or unsubstituted tetrazolyl group, a substituted or unsubstituted oxadiazolyl group, or a substituted or unsubstituted benzocarbazolyl group;

$L_{11}$, $L_{12}$ and $L_{13}$ are each independently an unsubstituted phenylene group, or a substituted or unsubstituted $C_7$-$C_{30}$ arylene group; and a, b, and c are each independently an integer from 0 to 3.

2. The organic light-emitting device of claim 1, wherein $R_1$ to $R_{12}$ are each independently a hydrogen atom, a deuterium, a substituted or unsubstituted methyl group, a substituted or unsubstituted ethyl group, a substituted or unsubstituted propyl group, a substituted or unsubstituted butyl group, a substituted or unsubstituted phenyl group, a substituted or unsubstituted biphenyl group, a substituted or unsubstituted naphthyl group, or a substituted or unsubstituted anthryl group, a substituted or unsubstituted phenanthrenyl group, or a substituted or unsubstituted pyrenyl group, and one of $Ar_1$ or $Ar_2$ is a substituted or unsubstituted phenyl group, a substituted or unsubstituted naphthyl group, a substituted or unsubstituted phenanthrenyl group, a substituted or unsubstituted anthryl group, a substituted or unsubstituted triphenylenyl group, a substituted or unsubstituted pyrenyl group, a substituted or unsubstituted chrysenyl group, a substituted or unsubstituted indenyl group, a substituted or unsubstituted fluorenyl group, or a substituted or unsubstituted fluoranthenyl group, and the other of $Ar_1$ or $Ar_2$ is a substituted or unsubstituted pyrrolyl group, a substituted or unsubstituted imidazolyl group, a substituted or unsubstituted pyrazolyl group, a substituted or unsubstituted pyridinyl group, a substituted or unsubstituted bipyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted carbazolyl group, a substituted or unsubstituted benzoimidazolyl group, a substituted or unsubstituted triazolyl group, a substituted or unsubstituted tetrazolyl group, a substituted or unsubstituted oxadiazolyl group, a substituted or unsubstituted triazinyl group, or a substituted or unsubstituted benzocarbazolyl group.

3. The organic light-emitting device of claim 1, wherein $R_1$ to $R_{12}$ are each independently a hydrogen atom, a deuterium, a substituted or unsubstituted methyl group, a substituted or unsubstituted ethyl group, a substituted or unsubstituted propyl group, or a substituted or unsubstituted butyl group, and one of $Ar_1$ or $Ar_2$ is a substituted or unsubstituted phenyl group, a substituted or unsubstituted naphthyl group, a substituted or unsubstituted phenanthrenyl group, or a substituted or unsubstituted anthryl group, and the other $Ar_1$ or $Ar_2$ is a substituted or unsubstituted pyridinyl group, a substituted or unsubstituted pyrazinyl group, a substituted or unsubstituted pyrimidinyl group, or a substituted or unsubstituted pyridazinyl group.

4. The organic light-emitting device of claim 1, wherein $R_1$ to $R_{12}$ are hydrogen atoms, and one of $Ar_1$ or $Ar_2$ is a substituted or unsubstituted phenyl group, and the other $Ar_1$ or $Ar_2$ is a substituted or unsubstituted pyrimidinyl group.

5. The organic light-emitting device of claim 1, wherein one or two of $Ar_{11}$, $Ar_{12}$, or $Ar_{13}$ are each independently an unsubstituted phenyl group, a substituted or unsubstituted naphthyl group, a substituted or unsubstituted phenanthrenyl group, a substituted or unsubstituted anthryl group, a substituted or unsubstituted triphenylenyl group, a substituted or unsubstituted pyrenyl group, a substituted or unsubstituted chrysenyl group, a substituted or unsubstituted indenyl group, a substituted or unsubstituted fluorenyl group, or a substituted or unsubstituted fluoranthenyl group, and the others of $Ar_{11}$, $Ar_{12}$, or $Ar_{13}$ are each independently a substituted or unsubstituted pyrrolyl group, a substituted or unsubstituted imidazolyl group, a substituted or unsubstituted pyrazolyl group, a substituted or unsubstituted bipyridinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted isoquinolinyl group, a substituted or unsubstituted benzoquinolinyl group, a substituted or unsubstituted carbazolyl group, a substituted or unsubstituted benzoimidazolyl group, a substituted or unsubstituted triazolyl group, a substituted or unsubstituted tetrazolyl group, a substituted or unsubstituted oxadiazolyl group, or a substituted or unsubstituted benzocarbazolyl group, $L_{11}$, $L_{12}$, and $L_{13}$ are each independently an unsubstituted phenylene group, a substituted or unsubstituted naphthylene group, a substituted or unsubstituted phenanthrenylene group, a substituted or unsubstituted anthrylene group, a substituted or unsubstituted triphenylenylene group, a substituted or unsubstituted pyrenylene group, a substituted or unsubstituted chrysenylene group, a substituted or unsubstituted indenylene group, a substituted or unsubstituted fluorenylene group, or a substituted or unsubstituted fluoranthenylene group, and a, b, and c are each independently an integer from 0 to 1.

6. The organic light-emitting device of claim 1, wherein one or two of $Ar_{11}$, $Ar_{12}$, or $Ar_{13}$ are each independently an unsubstituted phenyl group, a substituted or unsubstituted naphthyl group, a substituted or unsubstituted phenanthrenyl group, or a substituted or unsubstituted anthryl group, and the others of $Ar_{11}$, $Ar_{12}$, or $Ar_{13}$ are each independently a substituted or unsubstituted pyridazinyl group, a substituted or unsubstituted quinolinyl group, or a substituted or unsubstituted isoquinolinyl group, $L_{11}$, $L_{12}$, and $L_{13}$ are each independently an unsubstituted phenylene group, a substituted or unsubstituted naphthylene group, a substituted or unsubstituted phenanthrenylene group, or a substituted or unsubstituted anthrylene group, and a, b, and c are each independently an integer from 0 to 1.

7. The organic light-emitting device of claim 1, wherein one or two of $Ar_{11}$, $Ar_{12}$, or $Ar_{13}$ are each independently an unsubstituted phenyl group, a substituted or unsubstituted naphthyl group, or a substituted or unsubstituted phenanthrenyl group, and the others of $Ar_{11}$, $Ar_{12}$, or $Ar_{13}$ are each independently a substituted or unsubstituted quinolinyl group or a substituted or unsubstituted isoquinolinyl group, $L_{11}$, $L_{12}$, and $L_{13}$ are each independently an unsubstituted phenylene group, and a, b, and c are each independently an integer from 0 to 1.

8. The organic light-emitting device of claim 1, wherein $R_1$ to $R_{12}$ are hydrogen atoms, one of $Ar_1$ or $Ar_2$ is a substituted or unsubstituted phenyl group, and the other of $Ar_1$ or $Ar_2$ is a substituted or unsubstituted pyrimidinyl group, one or two of $Ar_{11}$, $Ar_{12}$, or $Ar_{13}$ are each independently an unsubstituted phenyl group, a substituted or unsubstituted naphthyl group, or a substituted or unsubstituted phenanthrenyl group, and the others of $Ar_{11}$, $Ar_{12}$, or $Ar_{13}$ are each independently a substituted or unsubstituted quinolinyl group or a substituted or unsubstituted isoquinolinyl group, $L_{11}$, $L_{12}$, and $L_{13}$ are each independently an unsubstituted phenylene group, and a, b, and c are each independently an integer from 0 to 1.

9. The organic light-emitting device of claim 1, wherein the compound represented by one of Formulae 1a to 1c comprises a compound selected from the group consisting of Compounds 1 to 6:

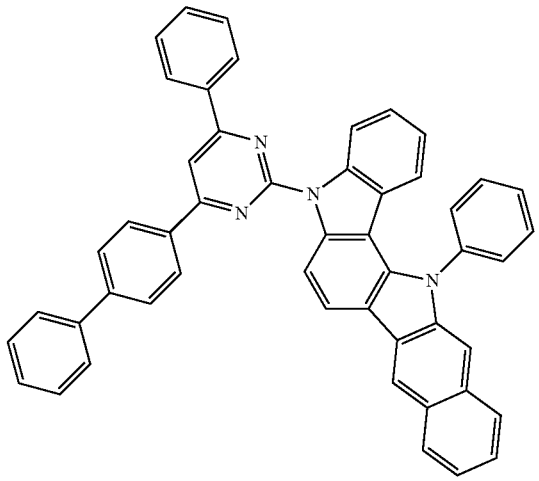

1

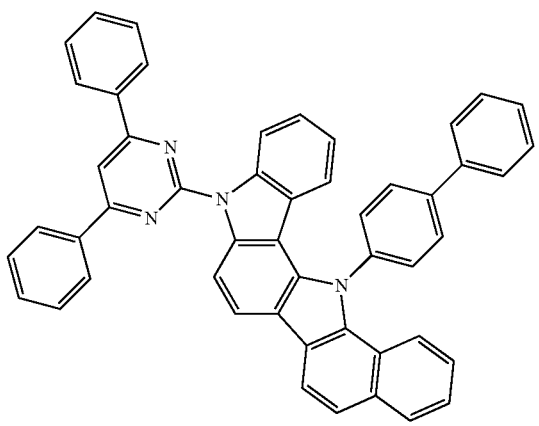

2

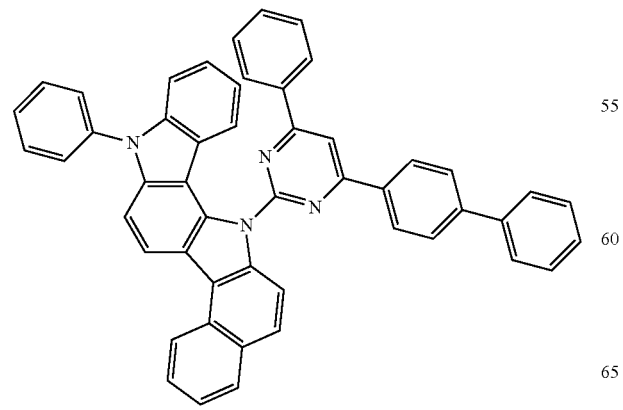

3

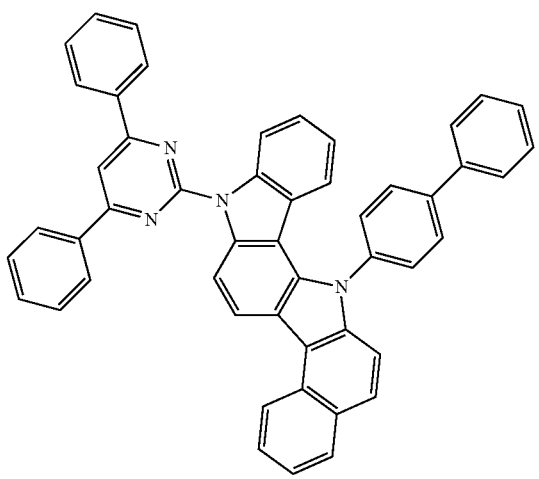

4

5
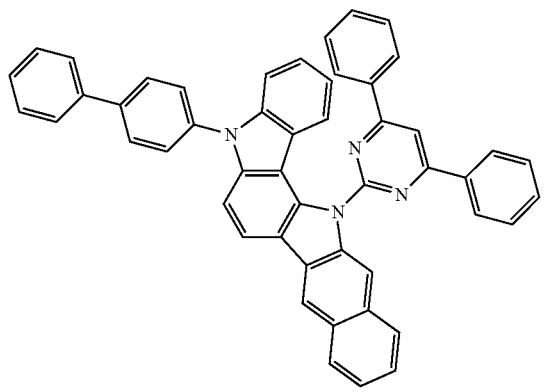
6
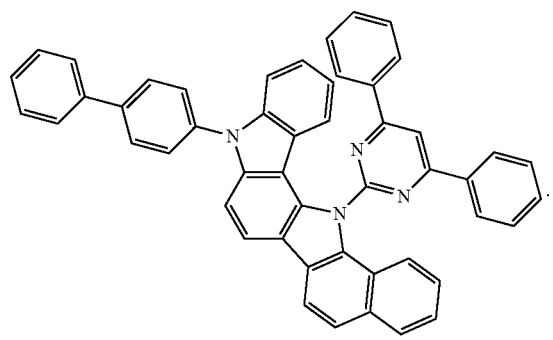
10. The organic light-emitting device of claim 1, wherein the compound represented by Formula 2 comprises a compound selected from the group consisting of Compounds 11 to 16:
11
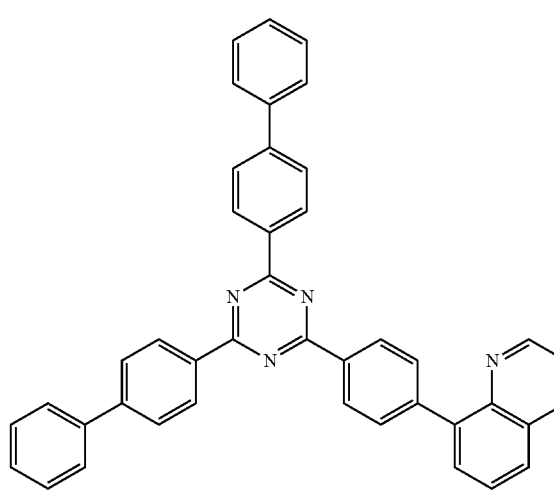
12
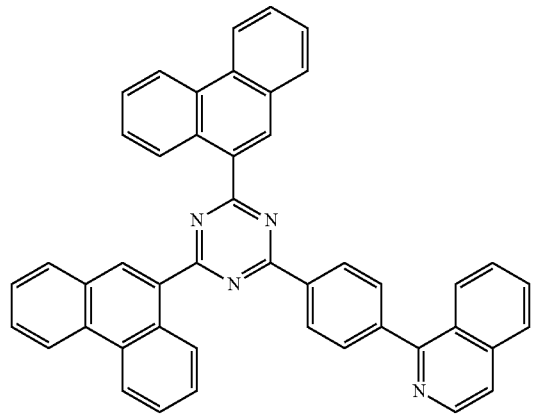
13
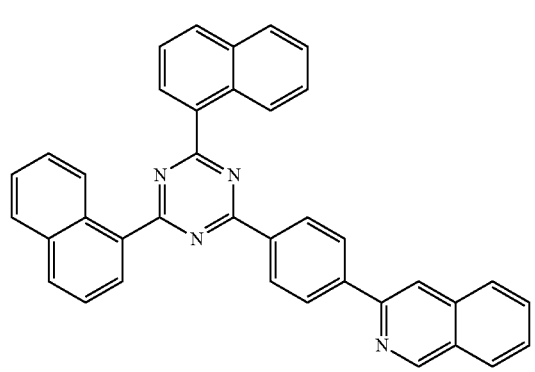
14
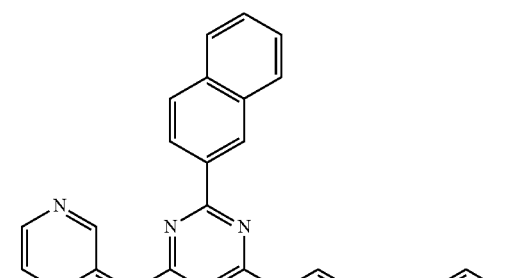
15
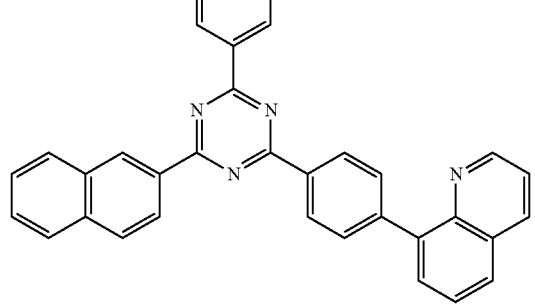

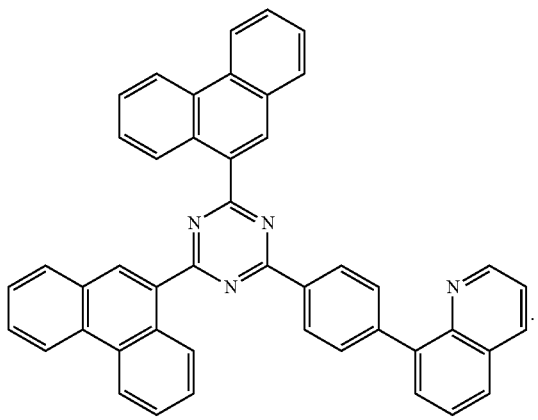

16

11. The organic light-emitting device of claim 1, wherein the metal-containing compound comprises an alkali metallic element.

12. The organic light-emitting device of claim 1, wherein the metal-containing compound comprises at least one selected from the group consisting of lithium quinolate (LiQ), lithium fluoride (LiF), and Compound 101:

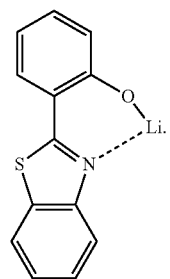

101

13. The organic light-emitting device of claim 1, wherein the metal-containing compound is present in an amount of about 20 to about 80 wt % based on the total weight of the electron transport layer.

14. The organic light-emitting device of claim 1, wherein the phosphorescent emission layer is a red emission layer.

15. The organic light-emitting device of claim 1, further comprising at least one layer between the first electrode and the phosphorescent emission layer, the at least one layer being selected from the group consisting of a hole injection layer, a hole transport layer, and a functional layer having both hole injecting and hole transporting capabilities.

16. The organic light-emitting device of claim 1, further comprising a hole transport layer between the first electrode and the phosphorescent emission layer, wherein the hole transport layer comprises a compound represented by Formula 3:

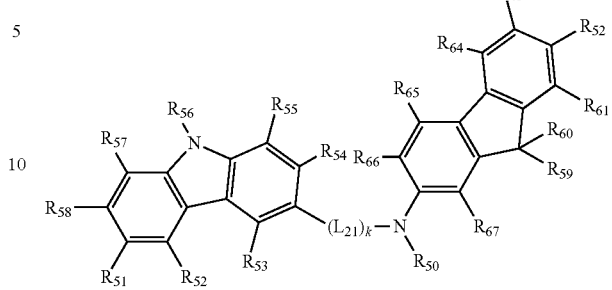

Formula 3 wherein $R_{50}$ is a substituted or unsubstituted phenyl group, a substituted or unsubstituted naphthyl group, a substituted or unsubstituted anthryl group, a substituted or unsubstituted biphenyl group, or a substituted or unsubstituted pyridyl group, $L_{21}$ is a substituted or unsubstituted $C_1$-$C_{30}$ alkylene group, a substituted or unsubstituted $C_2$-$C_{30}$ alkenylene group, a substituted or unsubstituted $C_6$-$C_{30}$ arylene group, or a substituted or unsubstituted $C_2$-$C_{30}$ heteroarylene group, $R_{51}$ to $R_{67}$ are each independently a hydrogen atom, a deuterium, a halogen atom, a hydroxyl group, a cyano group, a nitro group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthio group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{30}$ heteroaryl group, or —N($Q_{11}$)($Q_{12}$), wherein $Q_{11}$ and $Q_{12}$ are each independently a hydrogen atom, a deuterium, a halogen atom, a hydroxyl group, a cyano group, an amino group, a nitro group, a carboxyl group, a $C_1$-$C_{30}$ alkyl group, a $C_2$-$C_{30}$ alkenyl group, a $C_2$-$C_{30}$ alkynyl group, a $C_1$-$C_{30}$ alkoxy group, $C_1$-$C_{30}$ alkylthio group, a $C_3$-$C_{30}$ cycloalkyl group, a $C_3$-$C_{30}$ cycloalkenyl group, a $C_6$-$C_{30}$ aryl group, a $C_6$-$C_{30}$ aryloxy group, a $C_6$-$C_{30}$ arylthio group, or a $C_2$-$C_{30}$ heteroaryl group, and k is an integer from 0 to 3.

17. The organic light-emitting device of claim 16, wherein the hole transport layer further comprises a charge-generating material, wherein the charge-generating material comprises at least one of a quinone derivative, a metal oxide, or a cyano group-containing compound.

18. The organic light-emitting device of claim 16, further comprising a hole injection layer between the first electrode and the hole transport layer, wherein the hole injection layer comprises a compound represented by Formula 4:

Formula 4

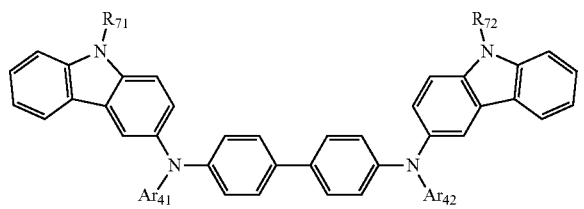

wherein $Ar_{41}$ and $Ar_{42}$ are each independently a substituted or unsubstituted $C_6$-$C_{30}$ arylene group or a substituted or unsubstituted $C_2$-$C_{30}$ heteroarylene group, and $R_{71}$ and $R_{72}$ are each independently a hydrogen atom, a deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_6$-$C_{30}$ aryl group, or a substituted or unsubstituted $C_6$-$C_{30}$ aryloxy group, or a substituted or unsubstituted $C_6$-$C_{30}$ arylthio group.

19. The organic light-emitting device of claim 1, further comprising an electron injection layer between the second electrode and the electron transport layer.

20. An organic light-emitting display apparatus comprising the organic light-emitting device of claim 1, and a transistor comprising a source, a drain, a gate, and an active layer, wherein the first electrode of the organic light-emitting device is electrically connected to the source or the drain of the transistor.

* * * * *